United States Patent
Rizo Diago et al.

(10) Patent No.: US 12,504,699 B2
(45) Date of Patent: Dec. 23, 2025

(54) CHARGE DISSIPATIVE RETICLE TABLE CLEANING RETICLE

(71) Applicants: ASML Holding N.V., Veldhoven (NL); ASML Netherlands B.V., Veldhoven (NL)

(72) Inventors: Pedro Julian Rizo Diago, Chappaqua, NY (US); George Grigorievich Voevodkin, Ossining, NY (US); Earl William Ebert, Oxford, CT (US)

(73) Assignee: ASML Holding N.V. & ASML Netherlands B.V., Veldhoven (NL)

( * ) Notice: Subject to any disclaimer, the term of this patent is extended or adjusted under 35 U.S.C. 154(b) by 92 days.

(21) Appl. No.: 18/266,361

(22) PCT Filed: Dec. 9, 2021

(86) PCT No.: PCT/EP2021/085090
§ 371 (c)(1),
(2) Date: Jun. 9, 2023

(87) PCT Pub. No.: WO2022/128750
PCT Pub. Date: Jun. 23, 2022

(65) Prior Publication Data
US 2024/0045346 A1 Feb. 8, 2024

Related U.S. Application Data

(60) Provisional application No. 63/127,540, filed on Dec. 18, 2020.

(51) Int. Cl.
*G03F 7/20* (2006.01)
*G03F 7/00* (2006.01)

(52) U.S. Cl.
CPC ...... *G03F 7/70925* (2013.01); *G03F 7/70741* (2013.01)

(58) Field of Classification Search
CPC ............ G03F 7/70925; G03F 7/70741; G03F 7/70708
See application file for complete search history.

(56) References Cited

U.S. PATENT DOCUMENTS

| 2008/0257383 A1 | 10/2008 | Levinson |
| 2013/0247935 A1 | 9/2013 | Park |

(Continued)

FOREIGN PATENT DOCUMENTS

| TW | 202013054 A | 4/2020 |

OTHER PUBLICATIONS

International Search Report and Written Opinion of the International Searching Authority directed to International Patent Application No. PCT/EP2021/085090, mailed Apr. 19, 2022; 10 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

A reticle stage cleaning apparatus for a reticle stage in a lithographic apparatus includes a substrate having a frontside and a backside opposite the frontside and a conductive layer disposed on the frontside of the substrate. The conductive layer is configured to contact the reticle stage to dissipate charge on the reticle stage and to remove particles on the reticle stage via an electrostatic field generated between the conductive layer and the reticle stage. The substrate can include a plurality of grooves and the conductive layer can be disposed on the frontside of the substrate and on a bottom surface of the plurality of grooves. The reticle stage cleaning apparatus can include a second conductive layer configured to remove particles on the reticle (Continued)

stage via a second electrostatic field and be disposed atop the conductive layer in the bottom surface of the plurality of grooves.

14 Claims, 10 Drawing Sheets

(56) References Cited

U.S. PATENT DOCUMENTS

| | | |
|---|---|---|
| 2015/0261104 A1 | 9/2015 | Kamo et al. |
| 2020/0096881 A1 | 3/2020 | Van Duivenbode et al. |
| 2020/0150549 A1 | 5/2020 | Stevens et al. |
| 2020/0348606 A1 | 11/2020 | Perez-Falcon et al. |

OTHER PUBLICATIONS

Taiwanese Office Action directed to Taiwanese Patent Application No. 110147338, mailed Aug. 14, 2025; 10 pages.

CHARGE DISSIPATIVE RETICLE TABLE CLEANING RETICLE

CROSS-REFERENCE TO RELATED APPLICATIONS

This application claims priority of U.S. Provisional Patent Application No. 63/127,540, which was filed on Dec. 18, 2020, and which is incorporated herein in its entirety by reference.

FIELD

The present disclosure relates to reticle table cleaning (RTC) apparatuses, systems, and methods, for example, charge dissipative and particle removing RTC apparatuses for lithographic apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, deep ultraviolet (DUV) radiation with a wavelength of 157 nm or 193 nm or 248 nm.

A reticle stage used in a lithographic apparatus to hold a patterning device can become contaminated over time (e.g., accumulate particles). The contamination can be transferred from the reticle stage to the patterning device, for example, by an electrostatic clamp that holds the patterning device during patterning. The contamination can accumulate on the patterning device and cause patterning errors and/or defects. A contaminated reticle stage can be manually cleaned, but manual cleaning can leave a residue of fine particles. Further, manual cleaning requires the lithographic apparatus be vented to atmospheric pressure and partially disassembled, reducing overall yield.

Current RTC devices use an insulating top coating that can accumulate charge over multiple cycles (e.g., trapping of charge carriers in insulating coating). Under vacuum, RTC devices can eventually stick to the reticle stage due to parasitic charge between opposing insulating contact surfaces. Parasitic charge requires that the lithographic apparatus be vented to atmospheric pressure and partially disassembled in order to manually separate the RTC device from the reticle stage. One way to dissipate charge between the reticle stage (e.g., the electrostatic clamp) and an RTC device is to use a separate conductive device disposed between each load of the RTC device. However, this process slows scanning ability and overall efficiency of the lithographic apparatus since two devices are needed.

SUMMARY

Accordingly, there is a need to dissipate charge on the reticle stage, remove particles from the reticle stage, and improve efficiency, scanning ability, and overall yield in the lithographic apparatus with a single conductive RTC device.

In some embodiments, a reticle stage cleaning apparatus for a reticle stage in a lithographic apparatus includes a substrate and a conductive layer. The substrate has a frontside and a backside opposite the frontside. The conductive layer is disposed on the frontside of the substrate and is configured to contact the reticle stage to dissipate charge on the reticle stage and to remove particles on the reticle stage via an electrostatic field generated between the conductive layer and the reticle stage.

In some embodiments, a stiffness of the conductive layer is lower than a stiffness of the substrate. In some embodiments, the conductive layer includes a conductive polymer. In some embodiments, the conductive polymer includes a conductive polyimide. In some embodiments, the conductive polyimide includes a doped polyimide comprising carbon, graphite, carbon black, carbon nanotubes, carbon fullerenes, metal particles, and/or some combination thereof.

In some embodiments, the reticle stage cleaning apparatus further includes a second layer disposed between the conductive layer and the substrate. In some embodiments, the second layer includes an insulating polymer.

In some embodiments, the conductive layer is substantially planar. In some embodiments, the conductive layer has a thickness no greater than 8 microns in order to generate the electrostatic field between the conductive layer and the reticle stage.

In some embodiments, the reticle stage cleaning apparatus further includes a voltage source electrically coupled to the conductive layer. In some embodiments, the voltage source is disposed within the substrate.

In some embodiments, the reticle stage cleaning apparatus further includes a positioner coupled to the backside of the substrate and configured to translate the conductive layer relative to the reticle stage.

In some embodiments, the reticle stage cleaning apparatus further includes a second conductive layer configured to remove particles on the reticle stage via a second electrostatic field generated between the second conductive layer and the reticle stage. In some embodiments, the substrate includes a plurality of grooves. In some embodiments, the conductive layer is disposed on the frontside of the substrate and on a bottom surface of the plurality of grooves. In some embodiments, the second conductive layer is disposed atop the conductive layer in the bottom surface of the plurality of grooves.

In some embodiments, a stiffness of the second conductive layer is lower than a stiffness of the conductive layer. In some embodiments, the second conductive layer includes a conductive polymer. In some embodiments, the conductive polymer includes a block or a sheet having a thickness greater than 8 microns.

In some embodiments, the plurality of grooves include a tapered cross-section. In some embodiments, the plurality of grooves in a plan view are arranged in rectangular rows, rectangular columns, a concentric shape, a spiral shape, an elliptical shape, a square shape, and/or a polygon shape.

In some embodiments, a lithographic apparatus includes an illumination system, a projection system, a reticle stage, and a reticle stage cleaning apparatus. The illumination system is configured to illuminate a patterning device. The projection system is configured to project an image of the patterning device onto a patterning substrate. The reticle stage is configured to support the patterning device. The reticle stage includes a chuck and an electrostatic clamp including a plurality of burls. The reticle stage cleaning apparatus is configured to dissipate charge on the electrostatic clamp and to remove particles on the electrostatic clamp. The reticle stage cleaning apparatus includes a substrate and a conductive layer. The substrate has a frontside and a backside opposite the frontside. The conductive layer is disposed on the frontside of the substrate and is configured to contact the plurality of burls of the electrostatic clamp and to remove particles on the electrostatic clamp via an electrostatic field generated between the conductive layer and the electrostatic clamp.

In some embodiments, the conductive layer includes a conductive polymer having a stiffness lower than a stiffness of the substrate.

In some embodiments, the lithographic apparatus further includes a second conductive layer configured to remove particles on the electrostatic clamp via a second electrostatic field generated between the second conductive layer and the electrostatic clamp. In some embodiments, the substrate includes a plurality of grooves. In some embodiments, the conductive layer is disposed on the frontside of the substrate and a bottom surface of the plurality of grooves. In some embodiments, the second conductive layer is disposed atop the conductive layer in the bottom surface of the plurality of grooves.

In some embodiments, the lithographic apparatus further includes a positioner coupled to the backside of the substrate and configured to translate the conductive layer relative to the plurality of burls of the electrostatic clamp.

In some embodiments, a method of forming a reticle stage cleaning apparatus for removing particles on a reticle stage in a lithographic apparatus includes forming a plurality of grooves in a substrate having a frontside and a backside opposite the frontside. In some embodiments, the method further includes disposing a conductive layer on the frontside of the substrate and on a bottom surface of the plurality of grooves. In some embodiments, the method further includes disposing a second conductive layer atop the conductive layer in the bottom surface of the plurality of grooves. In some embodiments, the second conductive layer includes a conductive polymer having a stiffness lower than a stiffness of the conductive layer.

In some embodiments, the disposing the second conductive layer includes disposing a spin-on conductive polymer in the plurality of grooves. In some embodiments, the disposing the second conductive layer includes disposing a spin-on adhesive in the plurality of grooves and disposing the conductive polymer atop the spin-on adhesive in the plurality of grooves. In some embodiments, the forming the plurality of grooves includes etching the substrate such that the plurality of grooves include a tapered cross-section. In some embodiments, the disposing the second conductive layer includes disposing a block or a sheet of the conductive polymer within the plurality of tapered grooves.

In some embodiments, a method of removing particles on a reticle stage in a lithographic apparatus includes forming a reticle stage cleaning apparatus. The reticle stage cleaning apparatus includes a substrate, a conductive layer, and a second conductive layer. The substrate has a frontside and a backside opposite the frontside. The substrate includes a plurality of grooves. The conductive layer is disposed on the frontside of the substrate and on a bottom surface of the plurality of grooves. The second conductive layer is disposed atop the conductive layer in the bottom surface of the plurality of grooves. The second conductive layer includes a conductive polymer having a stiffness lower than a stiffness of the conductive layer. In some embodiments, the method further includes contacting the reticle stage cleaning apparatus with a plurality of burls of an electrostatic clamp of the reticle stage. In some embodiments, the method further includes generating an electrostatic field between the reticle stage cleaning apparatus and the electrostatic clamp. In some embodiments, the method further includes removing particles disposed on the electrostatic clamp.

In some embodiments, the contacting includes contacting the plurality of burls with the conductive layer in order to dissipate charge on the electrostatic clamp. In some embodiments, the contacting includes contacting the plurality of burls with the second conductive layer in order to remove particles and parasitic charge on the electrostatic clamp. In some embodiments, the generating includes generating an electrostatic field between the second conductive layer and the electrostatic clamp.

In some embodiments, the method further includes repeating the contacting, the generating, and the removing steps to further remove particles from the electrostatic clamp to the reticle stage cleaning apparatus.

Implementations of any of the techniques described above may include an EUV light source, a DUV light source, a system, a method, a process, a device, and/or an apparatus. The details of one or more implementations are set forth in the accompanying drawings and the description below. Other features will be apparent from the description and drawings, and from the claims.

Further features and exemplary aspects of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

Figure 1:
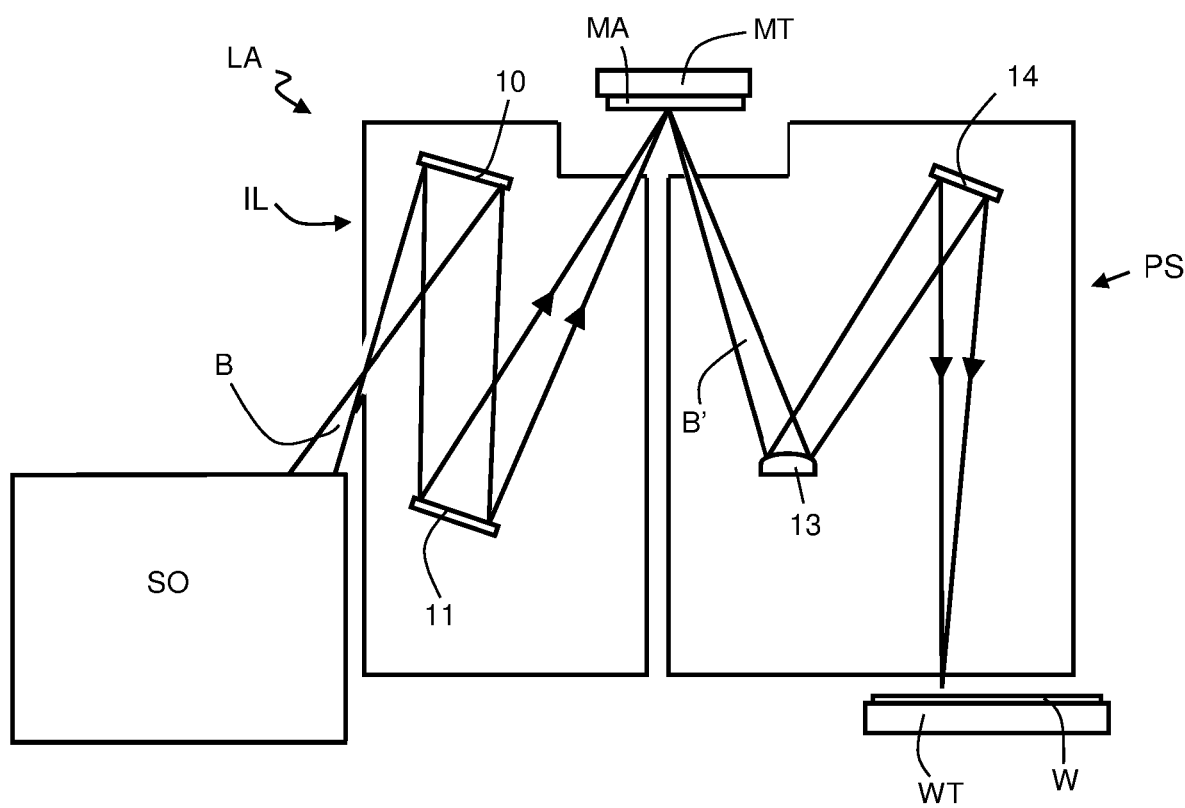
FIG. 1 is a schematic illustration of a lithographic apparatus, according to an exemplary embodiment.

The features and exemplary aspects of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this present invention. The disclosed embodiment(s) merely exemplify the present invention. The scope of the invention is not limited to the disclosed embodiment(s). The present invention is defined by the claims appended hereto.

The embodiment(s) described, and references in the specification to "one embodiment," "an embodiment," "an example embodiment," "an exemplary embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV and/or a DUV radiation beam B and to supply the EUV and/or DUV radiation beam B to the lithographic apparatus LA. The lithographic apparatus LA comprises an illumination system IL, a support structure MT (e.g., a mask table, a reticle table, a reticle stage) configured to support a patterning device MA (e.g., a mask, a reticle), a projection system PS, and a substrate table WT configured to support a substrate W.

The illumination system IL is configured to condition the EUV and/or DUV radiation beam B before the EUV and/or DUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV and/or DUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV and/or DUV radiation beam B interacts with the patterning device MA. This interaction may be reflective (as shown), which may be preferred for EUV radiation. This interaction may be transmissive, which may be preferred for DUV radiation. As a result of this interaction, a patterned EUV and/or DUV radiation beam B' is generated. The projection system PS is configured to project the patterned EUV and/or DUV radiation beam B' onto the substrate W. For that purpose, the projection system PS may comprise a plurality of mirrors 13, 14 which are configured to project the patterned EUV and/or DUV radiation beam B' onto the substrate W held by the substrate table WT. The projection system PS may apply a reduction factor to the patterned EUV and/or DUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV and/or DUV radiation beam B', with a pattern previously formed on the substrate W.

Exemplary Reticle Stage Apparatus and Reticle Apparatus

As discussed above, a reticle stage (e.g., support structure MT) used in a lithographic apparatus (e.g., lithographic apparatus LA) to hold a patterning device (e.g., patterning device MA) can become contaminated over time (e.g., accumulate particles). The contamination can be transferred from the reticle stage to the patterning device, for example, by an electrostatic clamp that holds the patterning device during patterning.

Figure 2:
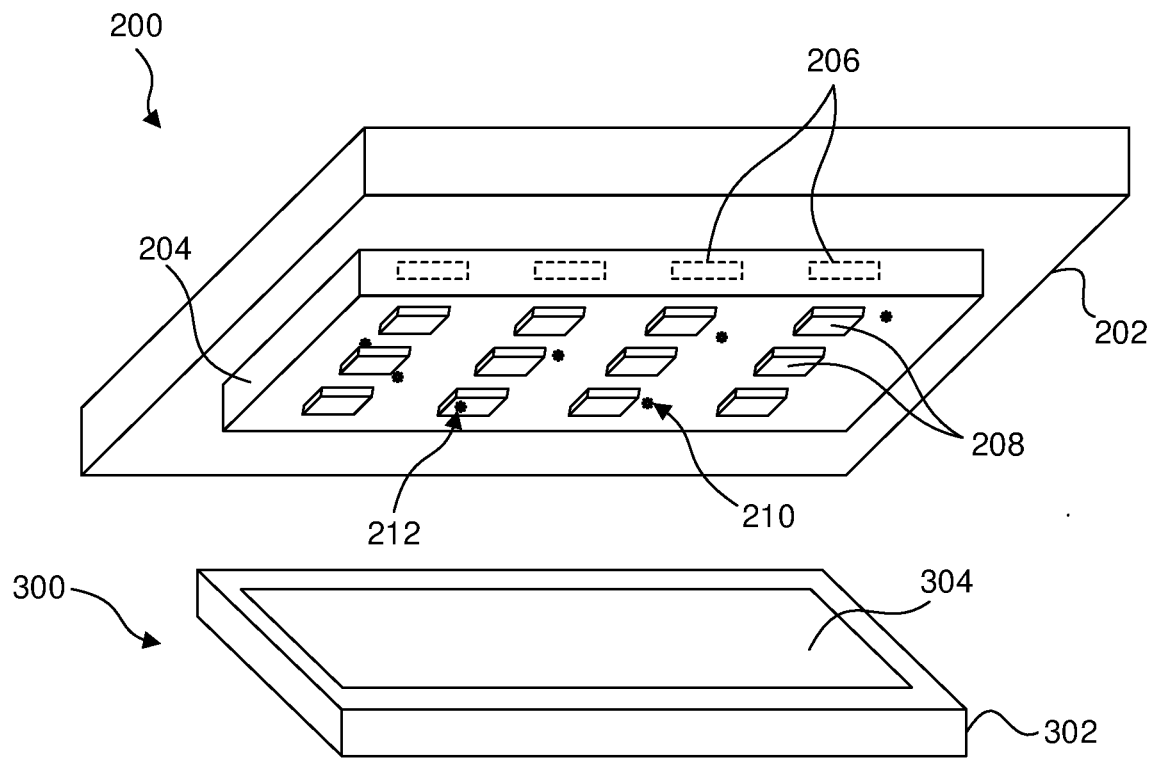
FIG. 2 is a schematic perspective illustration of a reticle stage and a reticle, according to an exemplary embodiment.
Figure 3:
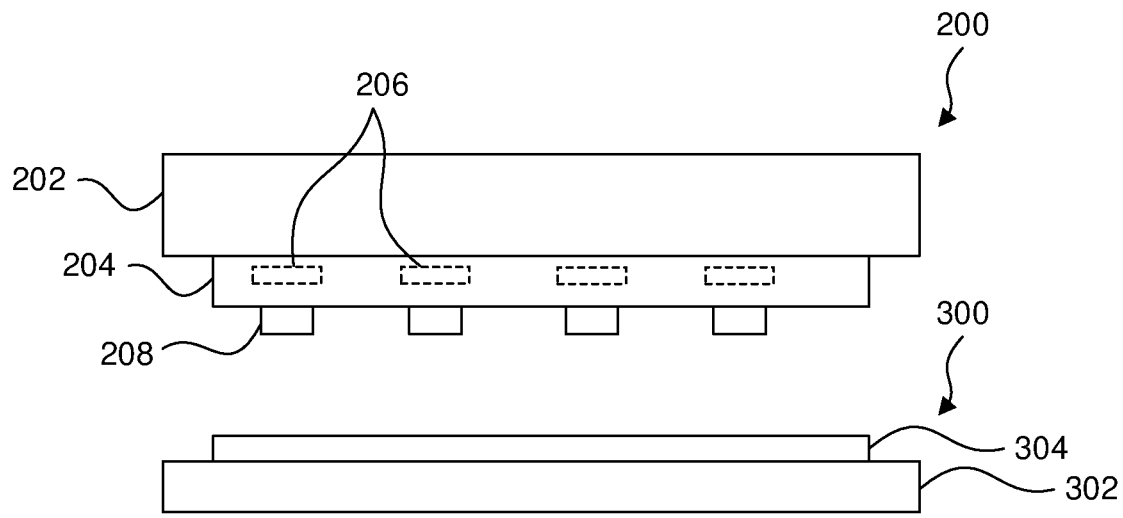
FIG. 3 is a schematic cross-sectional illustration of the reticle stage and the reticle shown in FIG. 2.

FIGS. 2 and 3 illustrate reticle stage 200 and reticle 300, according to various exemplary embodiments. FIG. 2 is a schematic illustration of reticle stage 200 and reticle 300, according to an exemplary embodiment. FIG. 3 is a schematic cross-sectional illustration of reticle stage 200 and reticle 300 shown in FIG. 2.

FIGS. 2 and 3 illustrate reticle stage 200, according to various exemplary embodiments. Reticle stage 200 can be configured to support a patterning device (e.g., reticle 300). Reticle stage 200 can be further configured to support a cleaning apparatus (e.g., RTC reticles 400, 400', 400", 400''', 400'''', 400''''', 400'''''' shown in FIGS. 4-14). Although reticle stage 200 is shown in FIGS. 2 and 3 as a stand-alone apparatus and/or system, the embodiments of this disclosure can be used with other apparatuses and/or systems, such as, but not limited to, lithographic apparatus LA, support structure MT, patterning device MA, reticle 300, and/or RTC reticles 400, 400', 400", 400''', 400'''', 400''''', 400''''''.

As shown in FIGS. 2 and 3, reticle stage 200 can include clamp chuck 202 and electrostatic clamp 204. Clamp chuck 202 can be configured to support electrostatic clamp 204 (e.g., by negative pressure). Electrostatic clamp 204 can be configured to support a patterning device (e.g., reticle 300) and/or a cleaning apparatus (e.g., RTC reticles 400, 400', 400", 400''', 400'''', 400''''', 400'''''') electrostatically. For example, a voltage can be applied to electrostatic clamp 204 to generate an electrostatic field between an object (e.g., reticle 300, RTC reticles 400, 400', 400", 400''', 400'''', 400''''', 400'''''') and electrostatic clamp 204 to hold the object.

As shown in FIGS. 2 and 3, electrostatic clamp 204 can include clamp electrodes 206 (e.g., embedded) and burls 208 (e.g., exterior projections or bumps). In some embodiments, clamp electrodes 206 can be embedded in electrostatic clamp 204 and aligned (e.g., vertically) with burls 208. Clamp electrodes 206 can be configured to generate an electrostatic field between burls 208 and/or an object (e.g., reticle 300, RTC reticles 400, 400', 400", 400''', 400'''', 400''''', 400''''''). Burls 208 can be configured to physically contact an object (e.g., reticle 300, RTC reticles 400, 400', 400", 400''', 400'''', 400''''', 400'''''') in order to clamp (e.g., electrostatically) and hold the object.

In some embodiments, as shown in FIG. 2, electrostatic clamp 204 can include various particles or contaminants on an exterior surface (e.g., contacting surface). For example, first particle 210 can be disposed between burls 208 and second particle 212 can be disposed on burls 208. Contaminants (e.g., first particle 210, second particle 212) can accumulate on electrostatic clamp 204 and cause patterning errors and/or defects. For example, contaminants (e.g., first particle 210, second particle 212) can be transferred to an object (e.g., reticle 300, RTC reticles 400, 400', 400", 400''', 400'''', 400''''', 400'''''') during electrostatic clamping of the object.

In some embodiments, electrostatic clamp 204 can be configured to provide a voltage on an object (e.g., reticle 300, RTC reticles 400, 400', 400", 400''', 400'''', 400''''', 400'''''') relative to reticle stage 200 (e.g., burls 208 of electrostatic clamp 204). For example, clamp electrodes 206 can provide a voltage difference $\Delta V$ (e.g., from an applied negative voltage ($-V$) or positive voltage ($+V$)) between reticle stage 200 and the object such that an electrostatic field is generated between reticle stage 200 and the object. The generated electrostatic field creates an electrostatic force (e.g., Lorentz force) and/or a Van der Waals force on contaminants (e.g., first particle 210, second particle 212, etc.) and causes the contaminants to move from reticle stage 200 (e.g., electrostatic clamp 204) to the object.

FIGS. 2 and 3 illustrate reticle 300, according to various exemplary embodiments. Reticle 300 can be configured to generate a patterned radiation beam (e.g., patterned EUV and/or DUV radiation beam B'). Although reticle 300 is shown in FIGS. 2 and 3 as a stand-alone apparatus and/or system, the embodiments of this disclosure can be used with other apparatuses and/or systems, such as, but not limited to, lithographic apparatus LA, support structure MT, reticle stage 200, and/or patterning device MA.

As shown in FIGS. 2 and 3, reticle 300 can include patterning device 302 (e.g., patterning device MA) and backside layer 304. Backside layer 304 can be configured to contact burls 208 of electrostatic clamp 204 so that reticle stage 200 can hold (e.g., electrostatically) reticle 300 without damaging patterning device 302. Backside layer 304 can be disposed on a backside of patterning device 302. In some embodiments, backside layer 304 can include a polymer or a combination of polymers. For example, backside layer 304 can include polyimide, Viton®, polytetrafluoroethylene (PTFE), Teflon, fluoropolymers, and/or any other material with a stiffness lower than that of patterning device 302. Contaminants (e.g., first particle 210, second particle 212) on electrostatic clamp 204 and/or reticle 300 can cause damage to electrostatic clamp 204, damage to reticle 300, and/or patterning errors (e.g., overlay misalignment or voids).

Exemplary Reticle Table Cleaning (RTC) Reticle Apparatus

As discussed above, contaminants (e.g., first particle 210, second particle 212, etc.) can accumulate on a patterning device (e.g., reticle 300) and/or a patterning device support (e.g., reticle stage 200) and cause patterning errors and/or defects. A contaminated reticle stage (e.g., reticle stage 200) can be manually cleaned, but manual cleaning can leave a residue of fine particles, producing new contaminants. Further, manual cleaning requires the lithographic apparatus (e.g., lithographic apparatus LA) be vented to atmospheric pressure and partially disassembled, reducing overall yield.

Current RTC devices use an insulating top coating that can accumulate charge over multiple cycles (e.g., trapping of charge carriers in insulating coating). Under vacuum, RTC devices can eventually stick to the reticle stage due to parasitic charge between opposing insulating contact surfaces. Parasitic charge requires that the lithographic apparatus be vented to atmospheric pressure and partially disassembled in order to manually separate the RTC device from the reticle stage. One way to dissipate charge between the reticle stage (e.g., the electrostatic clamp) and an RTC device is to use a separate conductive device disposed between each load of the RTC device. However, this process slows scanning ability and overall efficiency of the lithographic apparatus since two devices are needed.

Embodiments of RTC reticle apparatuses, systems, and methods as discussed below may dissipate charge on the reticle stage, remove particles from the reticle stage, and improve efficiency, scanning ability, and overall yield in the lithographic apparatus.

Figure 4:
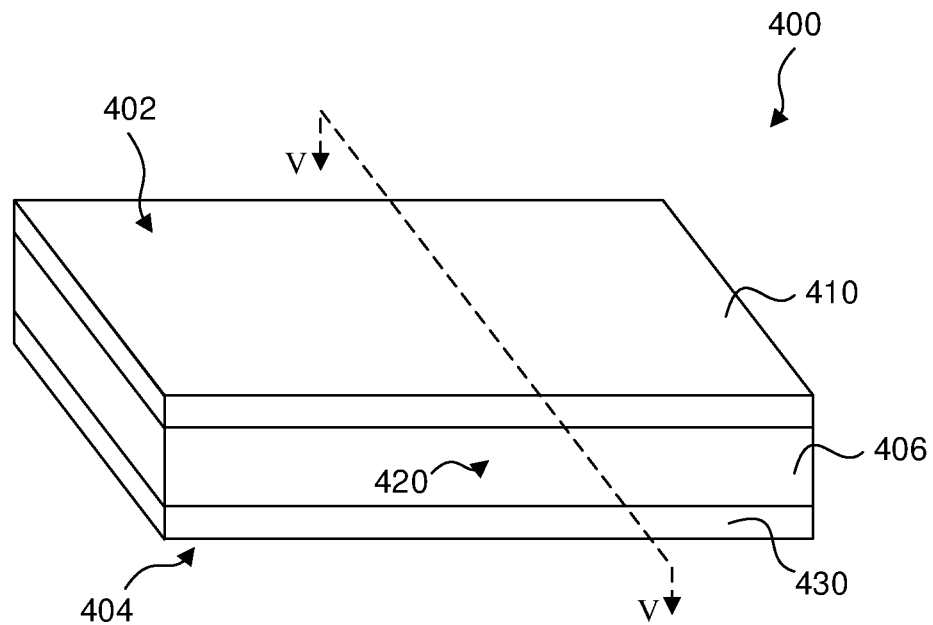
FIG. 4 is a schematic perspective illustration of a RTC reticle, according to an exemplary embodiment.
Figure 5:
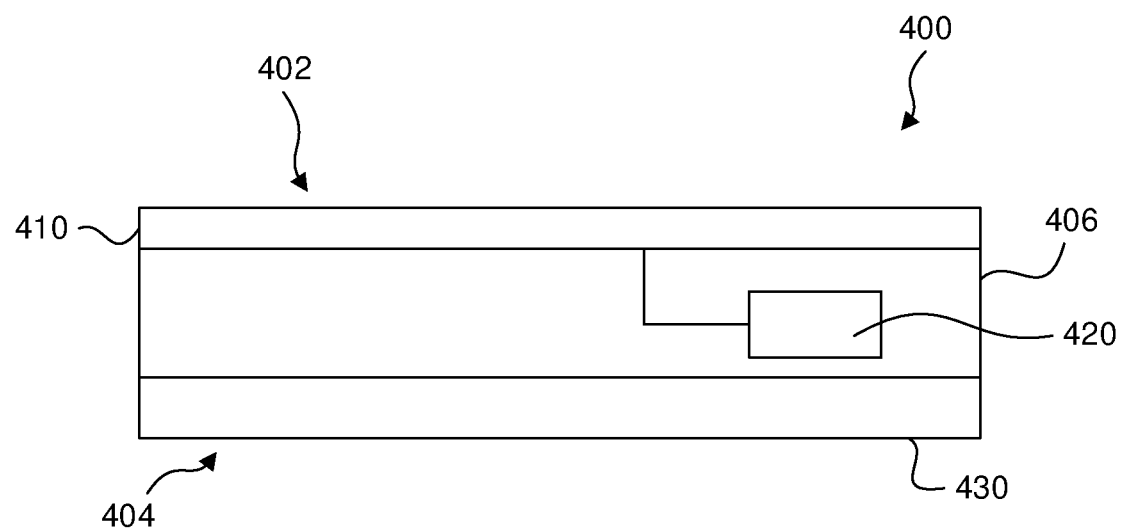
FIG. 5 is a schematic cross-sectional illustration of the RTC reticle shown in FIG. 4.

FIGS. 4 and 5 illustrate RTC reticle 400, according to various exemplary embodiments.

FIG. 4 is a schematic perspective illustration of RTC reticle 400, according to an exemplary embodiment. FIG. 5 is a schematic cross-sectional illustration of RTC reticle 400 shown in FIG. 4 (along the plane indicated by V-V in FIG. 4). RTC reticle 400 can be configured to clean reticle stage 200 in a lithographic apparatus (e.g., lithographic apparatus LA). RTC reticle 400 can be further configured to dissipate charge accumulated on reticle stage 200 (e.g., accumulated charge on electrostatic clamp 204). RTC reticle 400 can be further configured to remove contaminants (e.g., first particle 210, second particle 212, etc.) on reticle stage 200 (e.g., electrostatic clamp 204) via an electrostatic field generated between RTC reticle 400 and reticle stage 200. Although RTC reticle 400 is shown in FIGS. 4 and 5 as a stand-alone apparatus and/or system, the embodiments of this disclosure can be used with other apparatuses and/or systems, such as, but not limited to, lithographic apparatus LA, support structure MT, reticle stage 200, patterning device MA, and/or reticle 300.

As shown in FIGS. 4 and 5, RTC reticle 400 can include frontside 402, backside 404, substrate 406, first frontside layer 410, voltage source 420, and/or positioner 430. RTC reticle 400 has frontside 402 and backside 404 opposite frontside 402. Frontside 402 is configured to contact reticle stage 200. For example, frontside 402 can contact burls 208 of electrostatic clamp 204. In some embodiments, substrate 406 can be disposed between first frontside layer 410 and positioner 430. In some embodiments, substrate 406 can be an insulator. For example, substrate 406 can be quartz, silicon oxide, silicon, a glass, a ceramic, a semiconductor, and/or some combination thereof.

First frontside layer 410 can be configured to contact reticle stage 200 (e.g., burls 208 of electrostatic clamp 204) to dissipate charge accumulated on reticle stage 200. First frontside layer 410 can be further configured to contact reticle stage 200 (e.g., burls 208 of electrostatic clamp 204) to remove contaminants (e.g., first particle 210, second particle 212, etc.). First frontside layer 410 can be disposed on a frontside of substrate 406 (e.g., frontside 402). In some embodiments, first frontside layer 410 can be conductive. For example, first frontside layer 410 can include a metal (e.g., Cr, Au, Ti, Cu, Pt, Ag, etc.), a conductive polymer (e.g., conductive polyimide, Kapton® XC polyimide, Vespel® SP-202, etc.), a doped polymer (e.g., doped polyimide, PI-2574 with carbon, graphite, carbon black, carbon nanotubes, carbon fullerenes, and/or metal layers, particles, or flakes, etc.), and/or some combination thereof (e.g., metal coating atop insulating polyimide).

In some embodiments, first frontside layer 410 has a stiffness that is lower than a stiffness of substrate 406. For example, first frontside layer 410 can have a stiffness of 50 N/m and substrate 406 can have a stiffness of 1800 N/m. In some embodiments, first frontside layer 410 can be substantially planar. For example, as shown in FIGS. 4 and 5, first frontside layer 410 can be planar (e.g., uniform thickness). In some embodiments, first frontside layer 410 can have a thickness no greater than about 8 microns in order to generate an electrostatic field between first frontside layer 410 and reticle stage 200.

Figure 7:
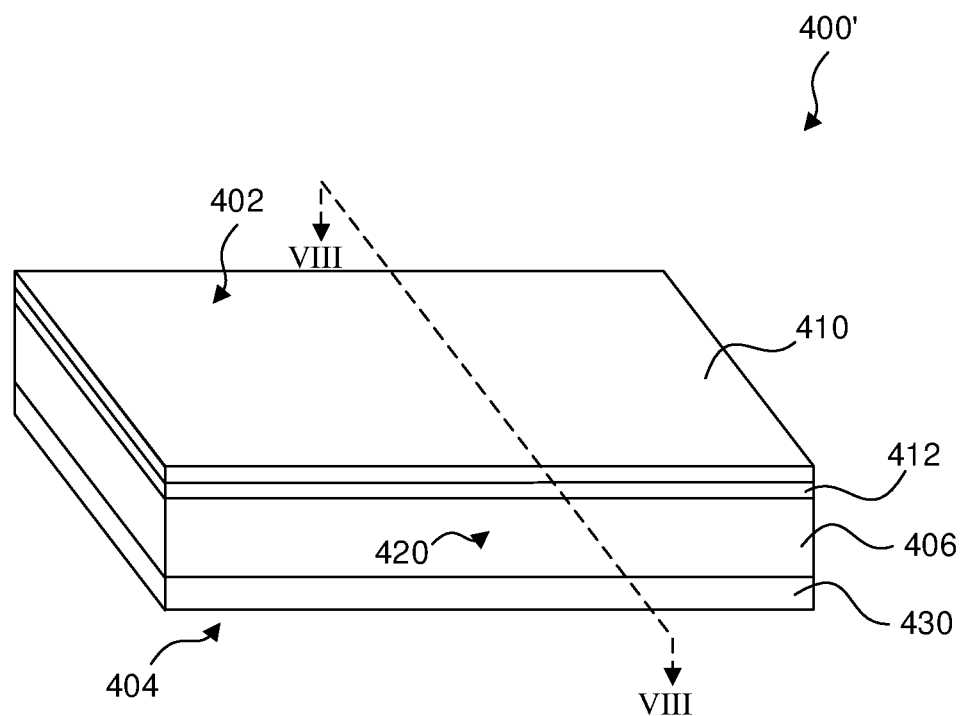
FIG. 7 is a schematic perspective illustration of a RTC reticle, according to an exemplary embodiment.
Figure 8:
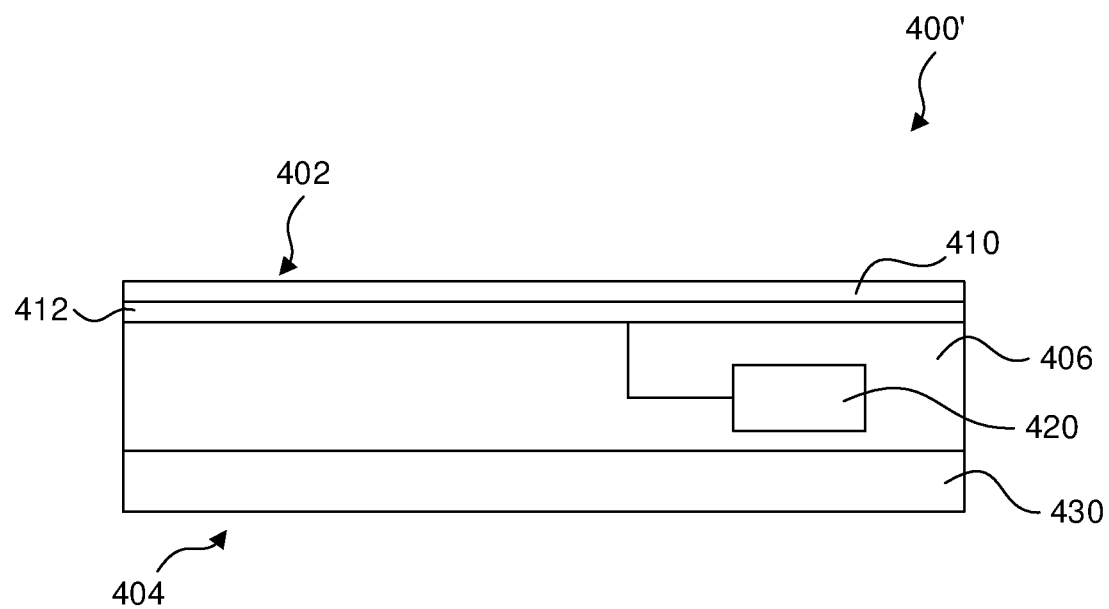
FIG. 8 is a schematic cross-sectional illustration of the RTC reticle shown in FIG. 7.

In some embodiments, RTC reticle 400 can further include second frontside layer 412 disposed between first frontside layer 410 and substrate 406. For example, as shown in FIGS. 7 and 8, second frontside layer 412 can be insulating (e.g., an insulating polymer) and disposed below first frontside layer 410 (e.g., a conductive metal and/or a conductive polymer).

Voltage source 420 can be configured to provide a voltage on first frontside layer 410 relative to reticle stage 200 (e.g., burls 208 of electrostatic clamp 204). For example, voltage source 420 can be electrically coupled to first frontside layer 410 to provide a voltage difference ΔV (e.g., from applied negative voltage (−V) or positive voltage (+V)) between reticle stage 200 and RTC reticle 400 such that an electrostatic field is generated between reticle stage 200 and RTC reticle 400. The generated electrostatic field creates an electrostatic force (e.g., Lorentz force) and/or a Van der Waals force on contaminants (e.g., first particle 210, second particle 212) and causes the contaminants to move from reticle stage 200 (e.g., electrostatic clamp 204) to RTC reticle 400 (e.g., first frontside layer 410).

In some embodiments, voltage source 420 can be internal to RTC reticle 400. For example, as shown in FIG. 5, voltage source 420 can be embedded or disposed within substrate 406. In some embodiments, voltage source 420 can be external to RTC reticle 400. In some embodiments, voltage source 420 can be a battery powered voltage source configured to provide a high voltage on frontside 402 of RTC reticle 400. In some embodiments, voltage source 420 can provide a voltage of about 1 kV to about 5 kV.

In some embodiments, RTC reticle 400 can omit voltage source 420 and first frontside layer 410 can act as a passive conductor (e.g., first frontside layer 410 can be grounded or maintained at 0 V). For example, clamp electrodes 206 of electrostatic clamp 204 can provide a voltage on burls 208 relative to first frontside layer 410 to generate an electrostatic field between electrostatic clamp 204 and first frontside layer 410.

Positioner 430 can be configured to translate first frontside layer 410 relative to reticle stage 200. For example, positioner 430 can translate first frontside layer 410 along a vertical direction (e.g., Z-axis) towards burls 208 of electrostatic clamp 204. In some embodiments, positioner 430 can be a six-axis translation stage (e.g., X, Y, Z, yaw, pitch, roll) for six degrees of freedom. For example, positioner 430 can be configured to contact RTC reticle 400 (e.g., first frontside layer 410) with reticle stage 200 in a first surface area, retract RTC reticle 400 from the first area, translate RTC reticle 400 to a second surface area of reticle stage 200, and contact RTC reticle (e.g., first frontside layer 410) with reticle stage 200 in the second surface area. In some embodiments, positioner 430 can include one or more linear motors (e.g., servomotors). In some embodiments, positioner 430 can be positioned at backside 404 of RTC reticle 400. For example, as shown in FIGS. 4 and 5, substrate 406 can be disposed atop positioner 430. In some embodiments, positioner 430 can be an exchange device for loading one or more reticles (e.g., RTC reticle 400) onto electrostatic clamp 204.

Exemplary Process Cycle

Figure 6A:
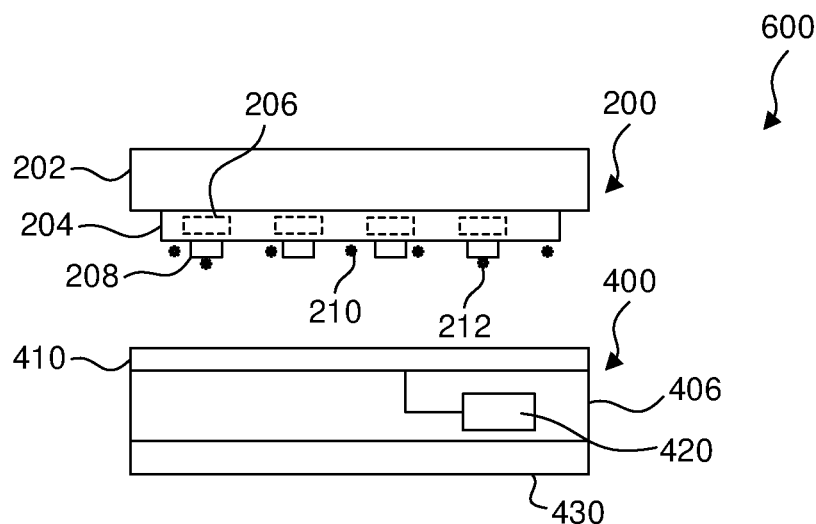
FIGS. 6A-6C illustrate a process cycle to remove particles from a reticle stage to a RTC reticle, according to an exemplary embodiment.
Figure 6B:
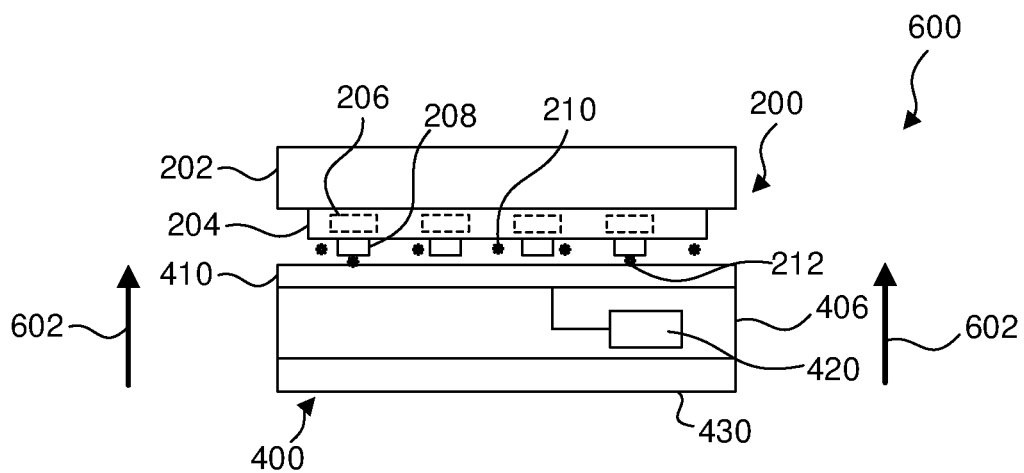
Figure 6C:
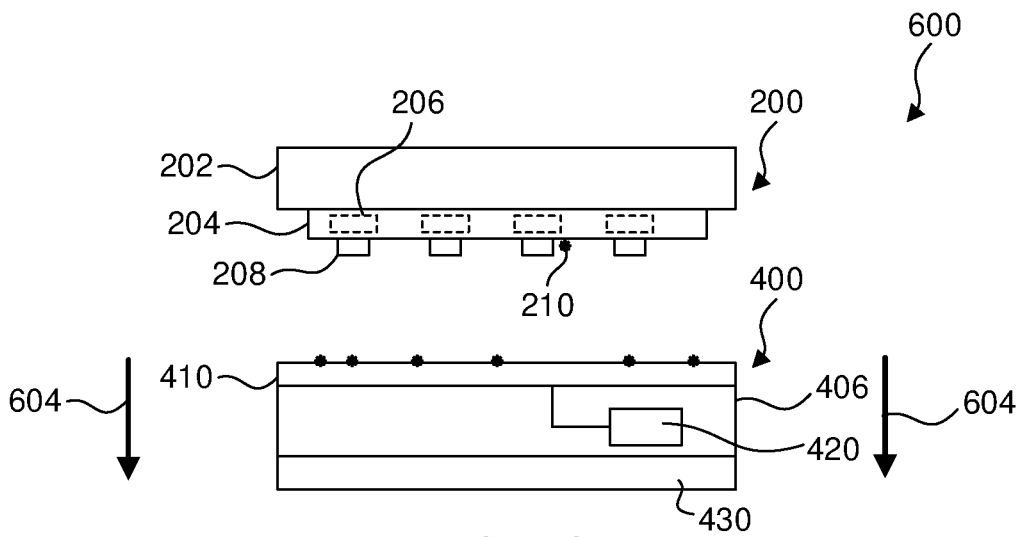

FIGS. 6A-6C illustrate process cycle 600 to remove contaminants (e.g., first particle 210, second particle 212, etc.) from reticle stage 200 to RTC reticle 400, according to various exemplary embodiments. FIG. 6A is a schematic cross-sectional illustration of reticle stage 200 and RTC reticle 400 in an initial step. FIG. 6B is a schematic cross-sectional illustration of reticle stage 200 and RTC reticle 400 in a contact step. FIG. 6C is a schematic cross-sectional illustration of reticle stage 200 and RTC reticle 400 in a retract step.

As shown in FIG. 6A, RTC reticle 400 can approach burls 208 of electrostatic clamp 204 of reticle stage 200 such that burls 208 oppose first frontside layer 410 (e.g., conductive) in a substantially perpendicular direction in an initial step. For example, positioner 430 can align first frontside layer 410 with burls 208 of electrostatic clamp 204. Contaminants (e.g., first particle 210, second particle 212, etc.) are disposed on an exterior surface of electrostatic clamp 204.

As shown in FIG. 6B, RTC reticle 400 can translate vertically (e.g., +Z-axis) towards reticle stage 200 along contact direction 602 and physically contact burls 208 of electrostatic clamp 204 in a contact step. During the contact step, a voltage difference ΔV can be applied between RTC reticle 400 and reticle stage 200 (e.g., by applying voltage to clamp electrodes 206 and/or first frontside layer 410) to generate an electrostatic field between RTC reticle 400 and reticle stage 200. The generated electrostatic field creates an electrostatic force (e.g., Lorentz force) and/or a Van der Waals force on contaminants (e.g., first particle 210, second particle 212, etc.) and causes the contaminants to move from reticle stage 200 to RTC reticle 400. Contaminants (e.g., first particle 210, second particle 212, etc.) contact first frontside layer 410 and remain on frontside 402. Further, any charge accumulated on electrostatic clamp 204 can be dissipated when first frontside layer 410 (e.g., conductive) contacts electrostatic clamp 204.

As shown in FIG. 6C, RTC reticle 400 can translate vertically (e.g., −Z-axis) away from reticle stage 200 along retract direction 604 and retract from burls 208 of electrostatic clamp 204 in a retract step. During the retract step, frontside 402 of RTC reticle 400 can retain most if not all of contaminants (e.g., first particle 210, second particle 212, etc.) from electrostatic clamp 204 on first frontside layer 410.

In some embodiments, the contact step shown in FIG. 6B and the retract step shown in FIG. 6C can be repeated (e.g., multiple cycles) to further remove contaminants (e.g., first particle 210, second particle 212, etc.) from electrostatic clamp 204 to RTC reticle 400. In some embodiments, process cycle 600 can include contacting reticle stage 200 with RTC reticle 400 in a first surface area, retracting RTC reticle 400, translating RTC reticle 400 (e.g., via positioner 430), and contacting reticle stage 200 with RTC reticle 400 in a second surface area different from the first surface area.

Exemplary Alternative RTC Reticle Apparatuses

Figure 9:
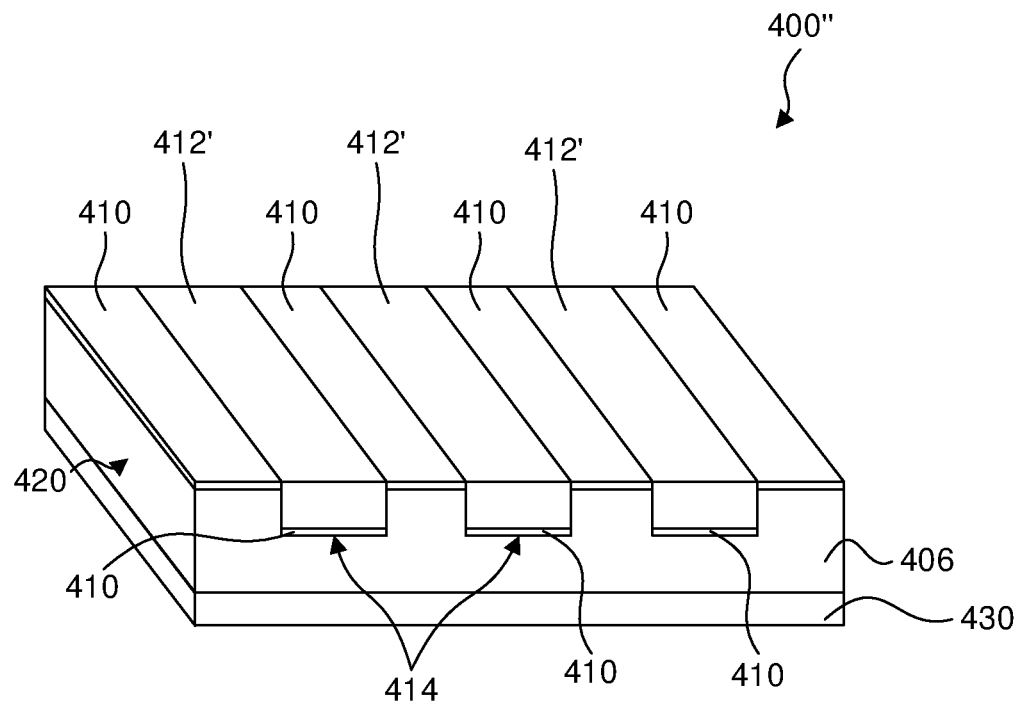
FIG. 9 is a schematic perspective illustration of a RTC reticle, according to an exemplary embodiment.
Figure 10:
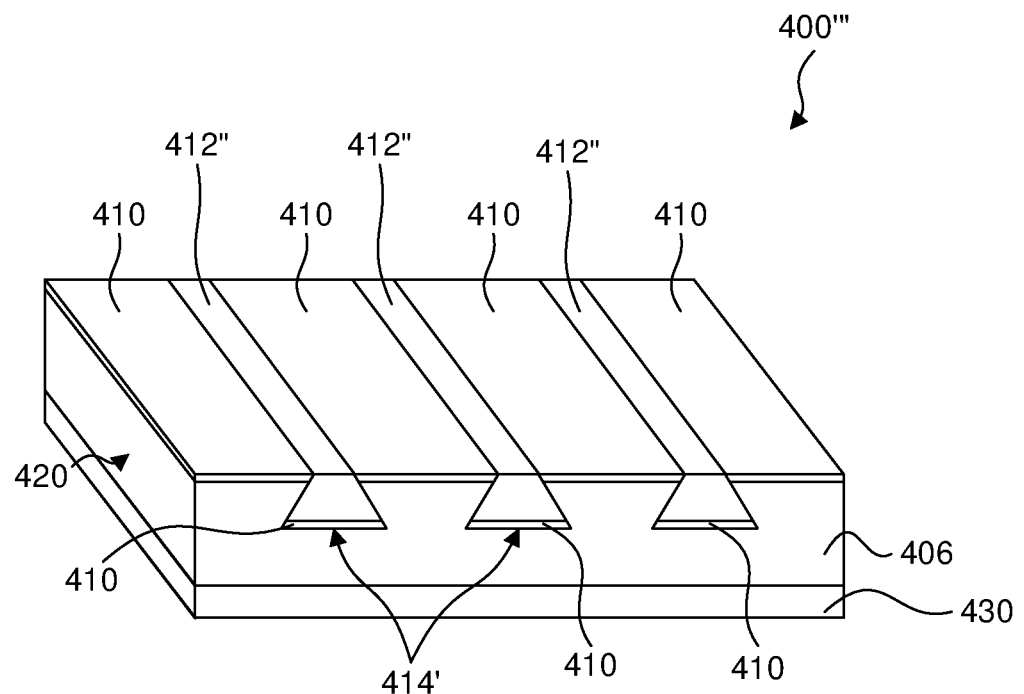
FIG. 10 is a schematic perspective illustration of a RTC reticle, according to an exemplary embodiment.
Figure 11:
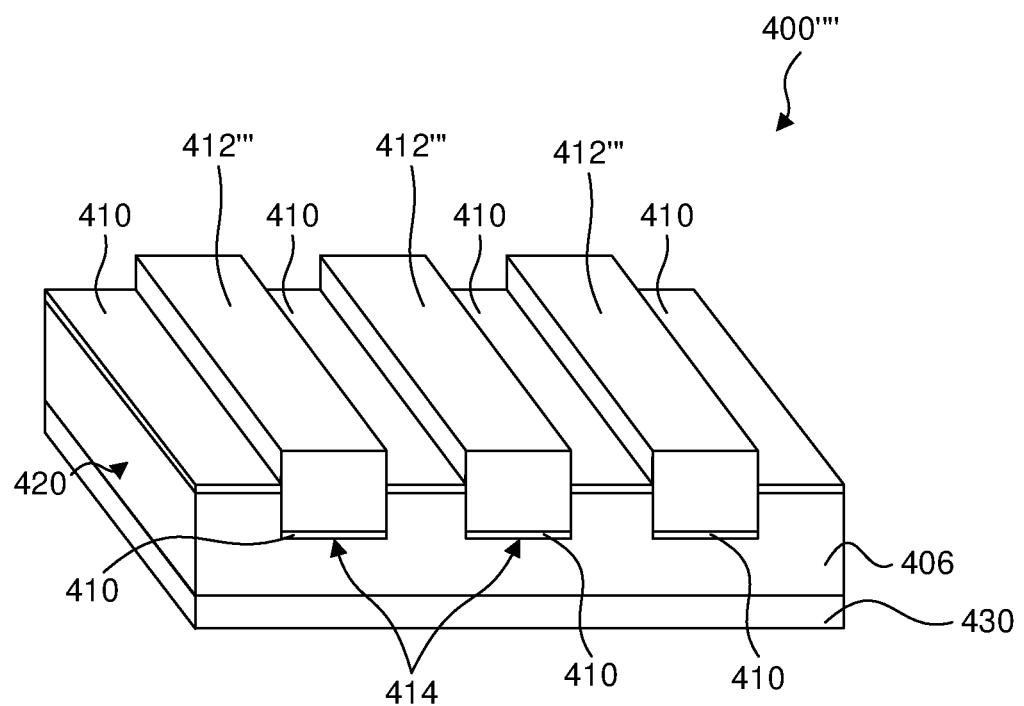
FIG. 11 is a schematic perspective illustration of a RTC reticle, according to an exemplary embodiment.
Figure 12:
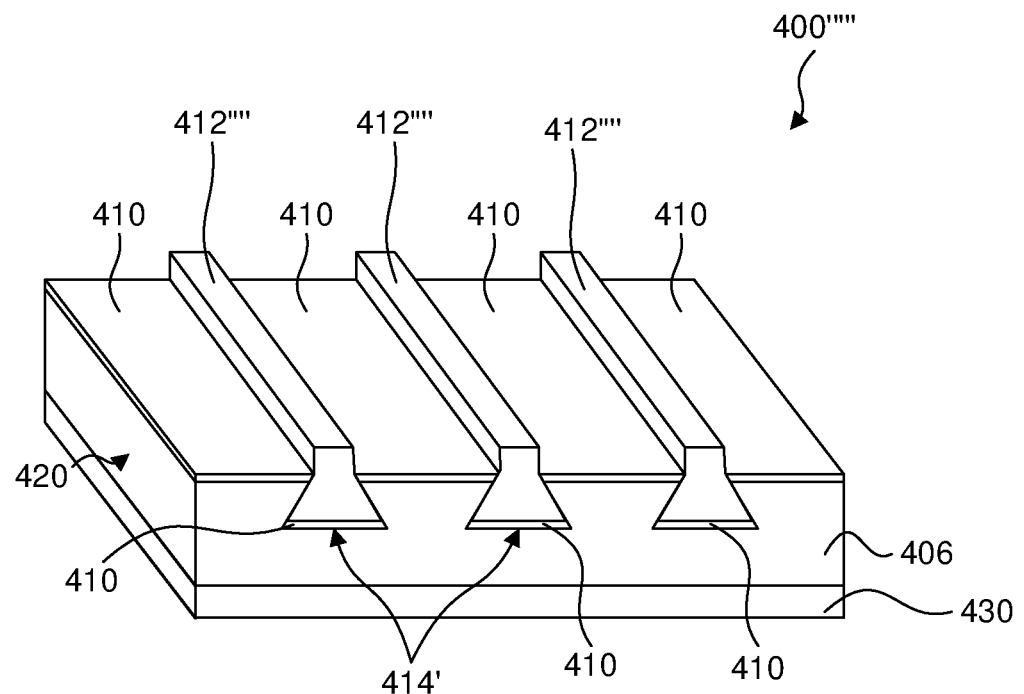
FIG. 12 is a schematic perspective illustration of a RTC reticle, according to an exemplary embodiment.
Figure 13:
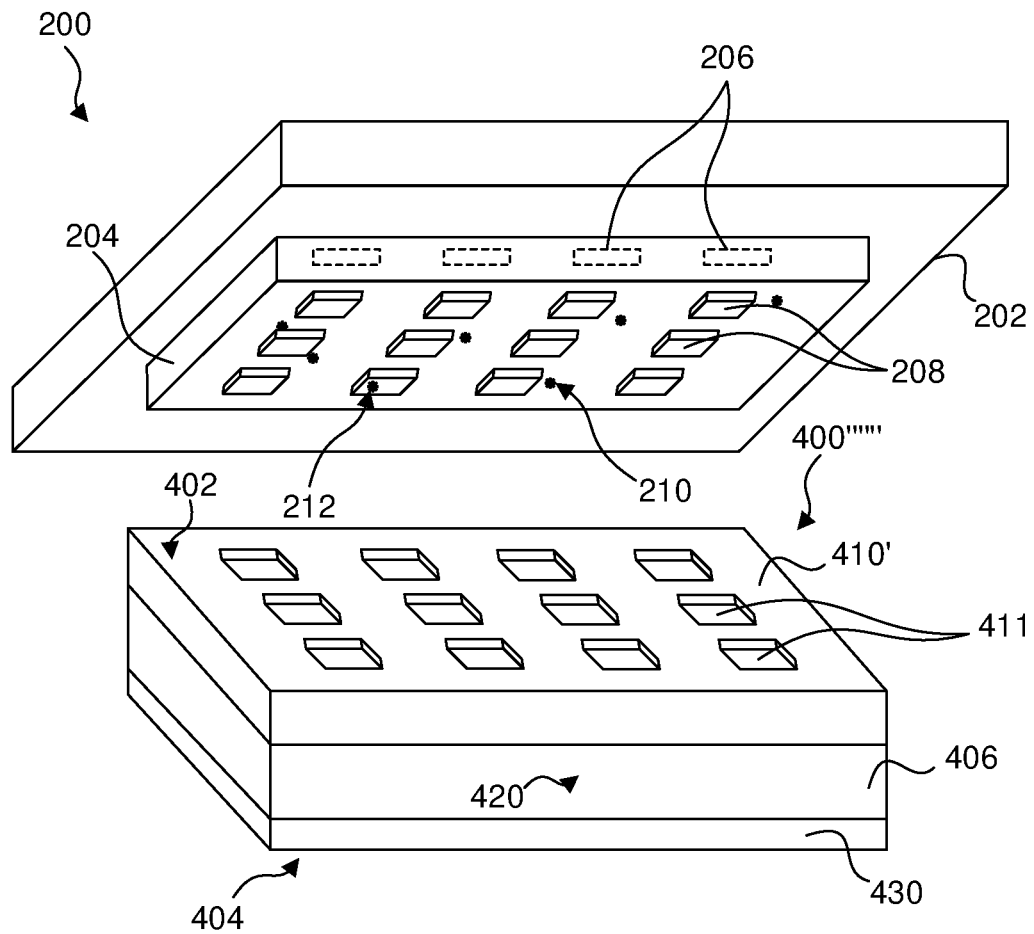
FIG. 13 is a schematic perspective illustration of a reticle stage and a RTC reticle, according to an exemplary embodiment.

FIGS. 7-14 illustrate RTC reticles 400', 400", 400''', 400'''', 400''''', 400'''''' according to various exemplary embodiments. FIG. 7 is a schematic perspective illustration of RTC reticle 400', according to an exemplary embodiment. FIG. 8 is a schematic cross-sectional illustration of RTC reticle 400' shown in FIG. 7 (along the plane indicated by VIII-VIII in FIG. 7). FIG. 9 is a schematic perspective illustration of RTC reticle 400", according to an exemplary embodiment. FIG. 10 is a schematic perspective illustration of RTC reticle 400''', according to an exemplary embodiment. FIG. 11 is a schematic perspective illustration of RTC reticle 400'''', according to an exemplary embodiment. FIG. 12 is a schematic perspective illustration of RTC reticle 400''''', according to an exemplary embodiment. FIG. 13 is a schematic perspective illustration of reticle stage 200 and RTC reticle 400'''''', according to an exemplary embodiment.

Figure 14:
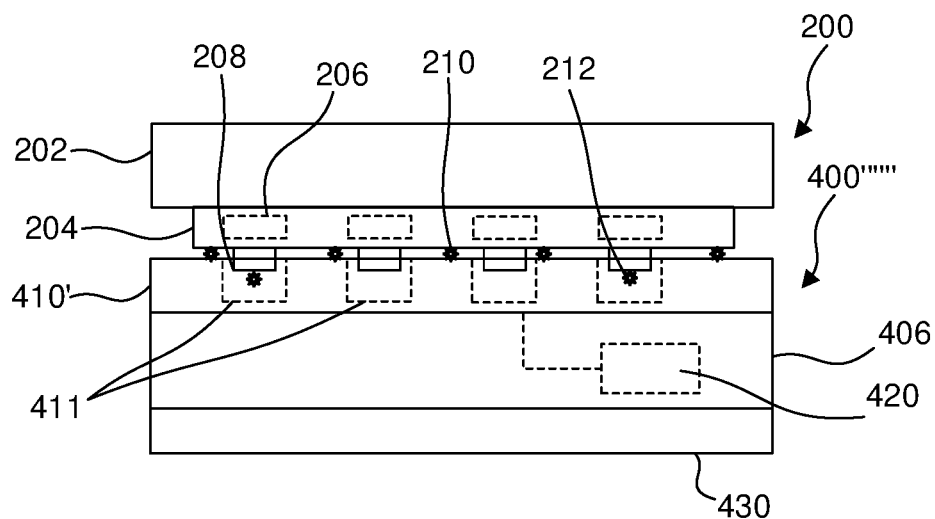
FIG. 14 is a schematic cross-sectional illustration of the reticle stage and the RTC reticle shown in FIG. 13.

FIG. 14 is a schematic cross-sectional illustration of reticle stage 200 and RTC reticle 400'''''' shown in FIG. 13.

FIGS. 7 and 8 illustrate RTC reticle 400', according to certain embodiments. The embodiments of RTC reticle 400 shown in FIGS. 4 and 5, for example, and the embodiments of RTC reticle 400' shown in FIGS. 7 and 8 may be similar. Similar reference numbers are used to indicate features of the embodiments of RTC reticle 400 shown in FIGS. 4 and 5 and the similar features of the embodiments of RTC reticle 400' shown in FIGS. 7 and 8. One difference between the embodiments of RTC reticle 400 shown in FIGS. 4 and 5 and the embodiments of RTC reticle 400' shown in FIGS. 7 and 8 is that RTC reticle 400' includes second frontside layer 412 disposed between substrate 406 and first frontside layer 410, rather than just first frontside layer 410 shown in FIGS. 4 and 5. Although RTC reticle 400' is shown in FIGS. 7 and 8 as a stand-alone apparatus and/or system, the embodiments of this disclosure can be used with other apparatuses and/or systems, such as, but not limited to, lithographic apparatus LA, support structure MT, reticle stage 200, patterning device MA, and/or reticle 300.

As shown in FIGS. 7 and 8, RTC reticle 400' can include second frontside layer 412. Second frontside layer 412 can be configured to generate an electrostatic field between reticle stage 200 and RTC reticle 400'. Second frontside layer 412 can be further configured to generate the electrostatic field to remove contaminants (e.g., first particle 210, second particle 212, etc.) on reticle stage 200 (e.g., electrostatic clamp 204). In some embodiments, as shown in FIG. 8, second frontside layer 412 can be electronically coupled to voltage source 420 in order to provide a voltage on second frontside layer 412.

In some embodiments, second frontside layer 412 can be insulating in order to generate an electrostatic field between reticle stage 200 and RTC reticle 400'. For example, second frontside layer 412 can include an insulating polymer, a combination of polymers, polyimide, Viton®, PTFE, Teflon, fluoropolymers, oxides, nitrides, and/or any other insulating material with a stiffness lower than that of first frontside layer 410.

In some embodiments, second frontside layer 412 can be conductive. For example, first frontside layer 410 can include a metal (e.g., Cr, Au, Ti, Cu, Pt, Ag, etc.), a conductive polymer (e.g., conductive polyimide, Kapton® XC polyimide, Vespel® SP-202, etc.), a doped polymer (e.g., doped polyimide, PI-2574 with carbon, graphite, carbon black, carbon nanotubes, carbon fullerenes, and/or metal layers, particles, or flakes, etc.), and/or some combination thereof.

FIG. 9 illustrates RTC reticle 400", according to certain embodiments. The embodiments of RTC reticle 400' shown in FIGS. 7 and 8, for example, and the embodiments of RTC reticle 400" shown in FIG. 9 may be similar. Similar reference numbers are used to indicate features of the embodiments of RTC reticle 400' shown in FIGS. 7 and 8 and the similar features of the embodiments of RTC reticle 400" shown in FIG. 9. Differences between the embodiments of RTC reticle 400' shown in FIGS. 7 and 8 and the embodiments of RTC reticle 400" shown in FIG. 9 are that RTC reticle 400" includes grooves 414 formed in substrate 406 and includes second frontside layer 412' disposed atop first frontside layer 410 in grooves 414, rather than second frontside layer 412 disposed between substrate 406 and first frontside layer 410 shown in FIGS. 7 and 8. Although RTC reticle 400" is shown in FIG. 9 as a stand-alone apparatus and/or system, the embodiments of this disclosure can be used with other apparatuses and/or systems, such as, but not limited to, lithographic apparatus LA, support structure MT, reticle stage 200, patterning device MA, and/or reticle 300.

As shown in FIG. 9, RTC reticle 400" includes grooves 414, first frontside layer 410, and second frontside layer 412'. Grooves 414 are formed in substrate 406. Grooves 414 can be configured to provide both a charge dissipative surface (e.g., first frontside layer 410) and a contaminant (e.g., first particle 210, second particle 212, etc.) removing surface (e.g., second front side layer 412') for electrostatic clamp 204. In some embodiments, grooves 414 can be periodic. For example, grooves 414 can have a uniform width. In some embodiments, grooves 414 can be arranged, in a plan view, in rectangular rows, rectangular columns, a concentric shape, a spiral shape, an elliptical shape, a square shape, and/or a polygon shape. For example, as shown in FIG. 9, grooves 414 can be arranged in rectangular columns (e.g., transverse grooves). In some embodiments, as shown in FIG. 9, grooves 414 can have a rectangular cross-section.

First frontside layer 410 can be configured to dissipate charge accumulated on reticle stage 200 (e.g., electrostatic clamp 204). First frontside layer 410 can be further configured to generate a first electrostatic field between reticle stage 200 and RTC reticle 400" (e.g., between burls 208). As shown in FIG. 9, first frontside layer 410 (e.g., conductive) can be disposed on a frontside (e.g., frontside 402) of substrate 406 and can be disposed on a bottom surface of grooves 414. In some embodiments, first frontside layer 410 can be electronically coupled to voltage source 420 in order to provide a voltage or maintain 0 V on first frontside layer 410.

Second frontside layer 412' can be configured to generate a second electrostatic field between reticle stage 200 and RTC reticle 400" (e.g., at burls 208) to remove contaminants (e.g., first particle 210, second particle 212, etc.) on reticle stage 200 (e.g., electrostatic clamp 204). As shown in FIG. 9, second frontside layer 412' can be disposed atop first frontside layer 410 in a bottom surface of grooves 414. In some embodiments, second frontside layer 412' has a stiffness that is lower than a stiffness of first frontside layer 410. For example, second frontside layer 412' can have a stiffness of 5 N/m and first frontside layer 410 can have a stiffness of 50 N/m.

In some embodiments, second frontside layer 412' can be a conductive polymer. For example, second frontside layer 412' can include conductive polyimide, Kapton® XC polyimide, Vespel® SP-202, doped polyimide (e.g., PI-2574 with carbon, graphite, carbon black, carbon nanotubes, carbon fullerenes, and/or metal layers, particles, or flakes, etc.), and/or some combination thereof. In some embodiments, second frontside layer 412' can be a block or a sheet of a conductive polymer. For example, the conductive polymer block or sheet can have a thickness greater than about 8 microns.

FIG. 10 illustrates RTC reticle 400''', according to certain embodiments. The embodiments of RTC reticle 400" shown in FIG. 9, for example, and the embodiments of RTC reticle 400''' shown in FIG. 10 may be similar. Similar reference numbers are used to indicate features of the embodiments of RTC reticle 400" shown in FIG. 9 and the similar features of the embodiments of RTC reticle 400''' shown in FIG. 10. Differences between the embodiments of RTC reticle 400" shown in FIG. 9 and the embodiments of RTC reticle 400''' shown in FIG. 10 are that RTC reticle 400''' includes grooves 414' (e.g., tapered, dovetailed) formed in substrate 406 and includes second frontside layer 412" with a tapered cross-section disposed atop first frontside layer 410 in grooves 414', rather than grooves 414 and second frontside layer 412' shown in FIG. 9. Although RTC reticle 400''' is shown in FIG. 10 as a stand-alone apparatus and/or system, the embodiments of this disclosure can be used with other apparatuses and/or systems, such as, but not limited to, lithographic apparatus LA, support structure MT, reticle stage 200, patterning device MA, and/or reticle 300.

As shown in FIG. 10, grooves 414' can have a tapered cross-section. In some embodiments, second frontside layer 412" can include a tapered cross-section. For example, as shown in FIG. 10, grooves 414' can form a dovetail in order to receive and secure second frontside layer 412' without any adhesive (e.g., epoxy).

FIG. 11 illustrates RTC reticle 400'''', according to certain embodiments. The embodiments of RTC reticle 400" shown in FIG. 9, for example, and the embodiments of RTC reticle 400'''' shown in FIG. 11 may be similar. Similar reference numbers are used to indicate features of the embodiments of RTC reticle 400" shown in FIG. 9 and the similar features of the embodiments of RTC reticle 400'''' shown in FIG. 11. One difference between the embodiments of RTC reticle 400" shown in FIG. 9 and the embodiments of RTC reticle 400'''' shown in FIG. 11 is that RTC reticle 400'''' includes second frontside layer 412''' that extends beyond grooves 414 formed in substrate 406 and extends beyond an exterior surface of first frontside layer 410, rather than second frontside layer 412' shown in FIG. 9 that is flush with grooves 414 and first frontside layer 410. Although RTC reticle 400'''' is shown in FIG. 11 as a stand-alone apparatus and/or system, the embodiments of this disclosure can be used with other apparatuses and/or systems, such as, but not limited to, lithographic apparatus LA, support structure MT, reticle stage 200, patterning device MA, and/or reticle 300.

As shown in FIG. 11, second frontside layer 412''' can extend and/or protrude above (e.g., vertically) an exterior surface (e.g., frontside 402) of first frontside layer 410 and grooves 414. In some embodiments, second frontside layer 412''' can be aligned with burls 208 of electrostatic clamp 204 such that burls 208 can be alternately contacted by second frontside layer 412''' and first frontside layer 410 when RTC reticle 400'''' is displaced laterally (e.g., via positioner 430). For example, a lateral spacing of each second frontside layer 412''' can be equal to a lateral spacing of burls 208.

In some embodiments, RTC reticle 400'''' can be configured to sequentially contact burls 208 with second frontside layer 412''' and first frontside layer 410 in order to remove contaminants (e.g., first particle 210, second particle 212, etc.) and/or parasitic charge on electrostatic clamp 204. For example, first frontside layer 410 can contact burls 208 to remove parasitic charge and RTC reticle 400'''' can translate laterally such that burls 208 contact second frontside layer 412''' to remove contaminants (e.g., first particle 210, second particle 212, etc.). In some embodiments, burls 208 can contact an exterior surface of second frontside layer 412'''. For example, burls 208 can be positioned between adjacent second frontside layers 412''' and be laterally translated across one or more exterior surfaces (e.g., a sidewall surface and/or a top surface) of second frontside layer 412'''.

FIG. 12 illustrates RTC reticle 400''''', according to certain embodiments. The embodiments of RTC reticle 400''' shown in FIG. 10, for example, and the embodiments of RTC reticle 400''''' shown in FIG. 12 may be similar. Similar reference numbers are used to indicate features of the embodiments of RTC reticle 400''' shown in FIG. 10 and the similar features of the embodiments of RTC reticle 400''''' shown in FIG. 12. One difference between the embodiments of RTC reticle 400''' shown in FIG. 10 and the embodiments of RTC reticle 400'''''' shown in FIG. 12 is that RTC reticle 400'''''' includes second frontside layer 412'''' that extends beyond grooves 414' formed in substrate 406 and extends beyond an exterior surface of first frontside layer 410, rather than second frontside layer 412'' shown in FIG. 10 that is flush with grooves 414' and first frontside layer 410. Although RTC reticle 400'''''' is shown in FIG. 12 as a stand-alone apparatus and/or system, the embodiments of this disclosure can be used with other apparatuses and/or systems, such as, but not limited to, lithographic apparatus LA, support structure MT, reticle stage 200, patterning device MA, and/or reticle 300.

As shown in FIG. 12, second frontside layer 412'''' can extend and/or protrude above (e.g., vertically) an exterior surface (e.g., frontside 402) of first frontside layer 410 and grooves 414'. In some embodiments, second frontside layer 412'''' can be aligned with burls 208 of electrostatic clamp 204 such that burls 208 can be alternately contacted by second frontside layer 412'''' and first frontside layer 410 when RTC reticle 400'''''' is displaced laterally (e.g., via positioner 430). For example, a lateral spacing of each second frontside layer 412'''' can be equal to a lateral spacing of burls 208.

In some embodiments, RTC reticle 400'''''' can be configured to sequentially contact burls 208 with second frontside layer 412'''' and first frontside layer 410 in order to remove contaminants (e.g., first particle 210, second particle 212, etc.) and/or parasitic charge on electrostatic clamp 204. For example, first frontside layer 410 can contact burls 208 to remove parasitic charge and RTC reticle 400'''''' can translate laterally such that burls 208 contact second frontside layer 412'''' to remove contaminants (e.g., first particle 210, second particle 212, etc.). In some embodiments, burls 208 can contact an exterior surface of second frontside layer 412''''. For example, burls 208 can be positioned between adjacent second frontside layers 412'''' and laterally translated across one or more exterior surfaces (e.g., a sidewall surface and/or a top surface) of second frontside layer 412''''.

FIGS. 13 and 14 illustrate RTC reticle 400'''''', according to certain embodiments. The embodiments of RTC reticle 400 shown in FIGS. 4 and 5, for example, and the embodiments of RTC reticle 400'''''' shown in FIGS. 13 and 14 may be similar. Similar reference numbers are used to indicate features of the embodiments of RTC reticle 400 shown in FIGS. 4 and 5 and the similar features of the embodiments of RTC reticle 400'''''' shown in FIGS. 13 and 14. One difference between the embodiments of RTC reticle 400 shown in FIGS. 4 and 5 and the embodiments of RTC reticle 400'''''' shown in FIGS. 13 and 14 is that RTC reticle 400'''''' includes first frontside layer recesses 411 formed in first frontside layer 410' and configured to receive corresponding burls 208 of electrostatic clamp 204, rather than just first frontside layer 410 shown in FIGS. 4 and 5. Although RTC reticle 400'''''' is shown in FIGS. 13 and 14 as a stand-alone apparatus and/or system, the embodiments of this disclosure can be used with other apparatuses and/or systems, such as, but not limited to, lithographic apparatus LA, support structure MT, reticle stage 200, patterning device MA, and/or reticle 300.

As shown in FIGS. 13 and 14, RTC reticle 400'''''' can include first frontside layer 410' with first frontside layer recesses 411. First frontside layer 410' can be configured to generate an electrostatic field between reticle stage 200 and RTC reticle 400''''''. First frontside layer 410' can be further configured to generate the electrostatic field to remove contaminants (e.g., first particle 210, second particle 212, etc.) on reticle stage 200 (e.g., electrostatic clamp 204). For example, as shown in FIG. 14, first frontside recesses 411 can receive burls 208 and first frontside layer 410' can contact an area between burls 208 in order to remove contaminants (e.g., first particle 210) on electrostatic clamp 204.

In some embodiments, as shown in FIG. 14, first frontside layer 410' can be electronically coupled to voltage source 420 in order to provide a voltage on first frontside layer 410'. In some embodiments, first frontside layer recesses 411 can be arranged in a pattern (e.g., linear, array, spiral, concentric, etc.) aligned with corresponding burls 208 of electrostatic clamp 204. For example, as shown in FIGS. 13 and 14, first frontside layer recesses 411 can be symmetrically arranged in an array (e.g., 3×4) in first frontside layer 410'. In some embodiments, first frontside layer recesses 411 can be a recess (empty void) within first frontside layer 410'. For example, first frontside layer recesses 411 can include holes, empty cuboids, voids, apertures, notches, and/or any other suitable geometric recess to receive burls 208. In some embodiments, first frontside layer recesses 411 can have a diameter (e.g., holes) or a diagonal (e.g., empty cuboids) of about 0.5 mm to about 3 mm. For example, first frontside layer recesses 411 can have a diameter of about 1 mm.

In some embodiments, first frontside layer 410' can be insulating in order to generate an electrostatic field between reticle stage 200 and RTC reticle 400''''''. For example, first frontside layer 410' can include an insulating polymer, a combination of polymers, polyimide, Viton®, PTFE, Teflon, fluoropolymers, oxides, nitrides, and/or any other insulating material. In some embodiments, burls 208 of electrostatic clamp 204 can be placed (positioned) within first frontside layer recesses 411 such that burls 208 do not contact first frontside layer 410' but an exterior surface of electrostatic clamp 204 surrounding burls 208 does contact first frontside layer 410' in order to remove contaminants (e.g., first particle 210) disposed between burls 208. For example, as shown in FIG. 14, burls 208 can be disposed in first frontside layer recesses 411 in order to remove first particles 210 between burls 208. In some embodiments, a depth of first frontside layer recesses 411 can be greater than a height of burls 208. For example, as shown in FIG. 14, first frontside layer 410' can have a thickness such that burls 208, when placed into first frontside layer recesses 411, cannot contact first frontside layer 410'.

In some embodiments, first frontside layer 410' can be conductive. For example, first frontside layer 410' can include a metal (e.g., Cr, Au, Ti, Cu, Pt, Ag, etc.), a conductive polymer (e.g., conductive polyimide, Kapton® XC polyimide, Vespel® SP-202, etc.), a doped polymer (e.g., doped polyimide, PI-2574 with carbon, graphite, carbon black, carbon nanotubes, carbon fullerenes, and/or metal layers, particles, or flakes, etc.), and/or some combination thereof.

Exemplary Manufacturing Flow Diagram

Figure 15:
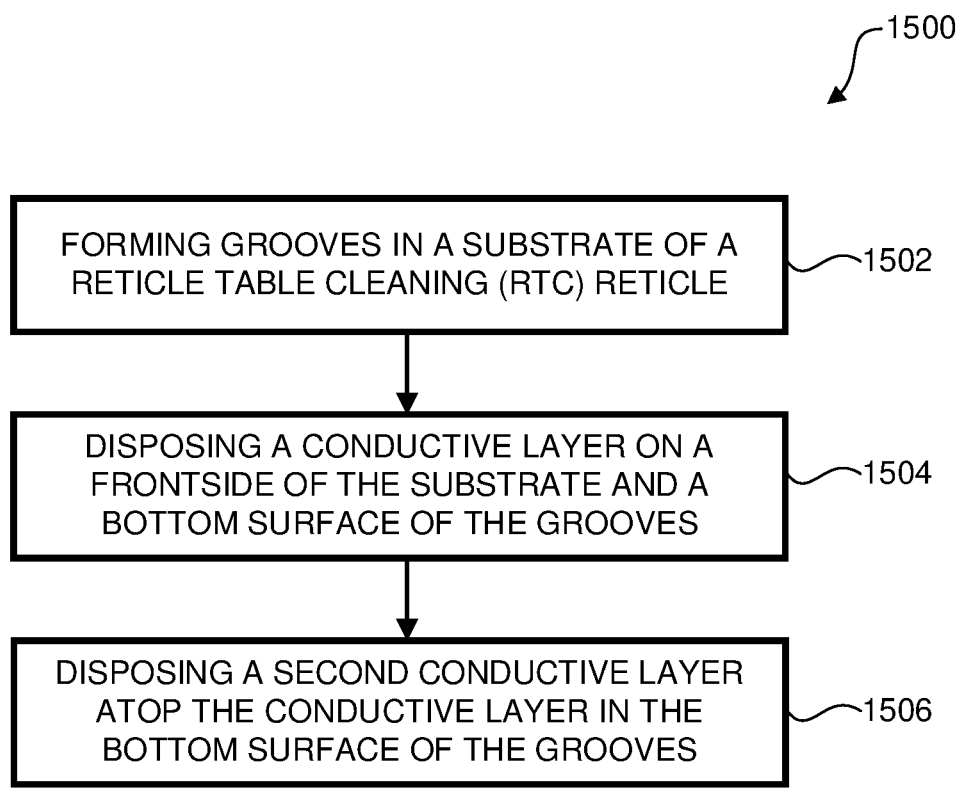
FIG. 15 illustrates a manufacturing flow diagram for manufacturing a RTC reticle, according to an exemplary embodiment.

FIG. 15 illustrates manufacturing flow diagram 1500 for manufacturing RTC reticles 400, 400', 400'', 400''', 400'''', 400''''', 400'''''', according to an exemplary embodiment. It is to be appreciated that not all steps in FIG. 15 are needed to perform the disclosure provided herein. Further, some of the steps may be performed simultaneously, sequentially, and/or in a different order than shown in FIG. 15. Manufacturing flow diagram 1500 shall be described with reference to FIGS. 4, 5, and 7-14. However, manufacturing flow diagram 1500 is not limited to those example embodiments.

In step 1502, as shown in the example of FIGS. 9 and 10, grooves 414, 414' can be formed in substrate 406. In some embodiments, grooves 414, 414' can be formed by etching substrate 406. For example, grooves 414, 414' can be formed by dry etching (e.g., reactive ion etching (RIE), deep RIE, Bosch etching, plasma etching, isotropic etching, anisotropic etching, etc.) and/or wet etching (e.g., selective etching (KOH, HF, HCl, HNO₃, NH₄F, NaOH, etc.), isotropic, anisotropic, etc.). In some embodiments, forming grooves 414, 414' in substrate 406 can be performed in one etching process or different etching processes. For example, the etching processes can be plasma processes, for example, RIE using oxygen-based plasma and a hard mask (e.g., silicon nitride) formed by photolithography.

In step 1504, as shown in the example of FIGS. 9 and 10, first frontside layer 410 can be deposited on frontside 402 of substrate 406 and a bottom surface of grooves 414, 414'. In some embodiments, first frontside layer 410 can be formed by deposition. For example, first frontside layer 410 can be formed or deposited by any suitable method including chemical vapor deposition (CVD), plasma-enhanced CVD (PECVD), low pressure CVD (LPCVD), atomic layer deposition (ALD), pulsed laser deposition (PLD), electron beam physical vapor deposition (EBPVD), sputtering (e.g., RF, electronic, potential, chemical), ion-beam deposition, spin-on deposition, liquid source misted chemical deposition, and/or other suitable deposition methods. In some embodiments, first frontside layer 410 can be conductive. For example, first frontside layer 410 can include a metal (e.g., Cr, Au, Ti, Cu, Pt, Ag, etc.), a conductive polymer (e.g., conductive polyimide, Kapton® XC polyimide, Vespel® SP-202, etc.), a doped polymer (e.g., doped polyimide, PI-2574 with carbon, graphite, carbon black, carbon nanotubes, carbon fullerenes, and/or metal layers, particles, or flakes, etc.), and/or some combination thereof (e.g., metal coating atop insulating polyimide).

In step 1506, as shown in the example of FIGS. 9 and 10, second frontside layer 412', 412" can be deposited atop first frontside layer 410 in the bottom surface of grooves 414, 414'. In some embodiments, second frontside layer 412', 412" can be formed by deposition. For example, second frontside layer 412', 412" can be formed or deposited by any suitable method including CVD, PECVD, LPCVD, ALD, PLD, EBPVD, sputtering (e.g., RF, electronic, potential, chemical), ion-beam deposition, spin-on deposition, liquid source misted chemical deposition, and/or other suitable deposition methods. In some embodiments, second frontside layer 412', 412" can be formed by adhering (e.g., epoxying, gluing, etc.) a block or a sheet into grooves 414, 414'. For example, as shown in FIG. 9, a liquid adhesive (e.g., epoxy, glue, etc.) can be spun onto substrate 406 into the bottom surface of grooves 414 and second frontside layer 412' can be inserted into grooves 414 and adhered to the liquid adhesive. In some embodiments, second frontside layer 412', 412" can be formed by inserting a block or a sheet into grooves 414, 414'. For example, as shown in FIG. 10, second frontside layer 412" can be inserted into and retained by grooves 414' (e.g., tapered).

In some embodiments, step 1502 can include etching substrate 406 such that grooves 414' have a tapered cross-section.

In some embodiments, step 1506 can include disposing a spin-on conductive polymer in grooves 414, 414' to form second frontside layer 412', 412". In some embodiments, step 1506 can include disposing a spin-on adhesive in grooves 414, 414' and then disposing second frontside layer 412', 412" atop the spin-on adhesive to secure second frontside layer 412', 412" in grooves 414, 414'. In some embodiments, step 1506 can include disposing a tapered block or a tapered sheet of conductive polymer within grooves 414' to form second frontside layer 412".

Exemplary Cleaning Flow Diagram

Figure 16:
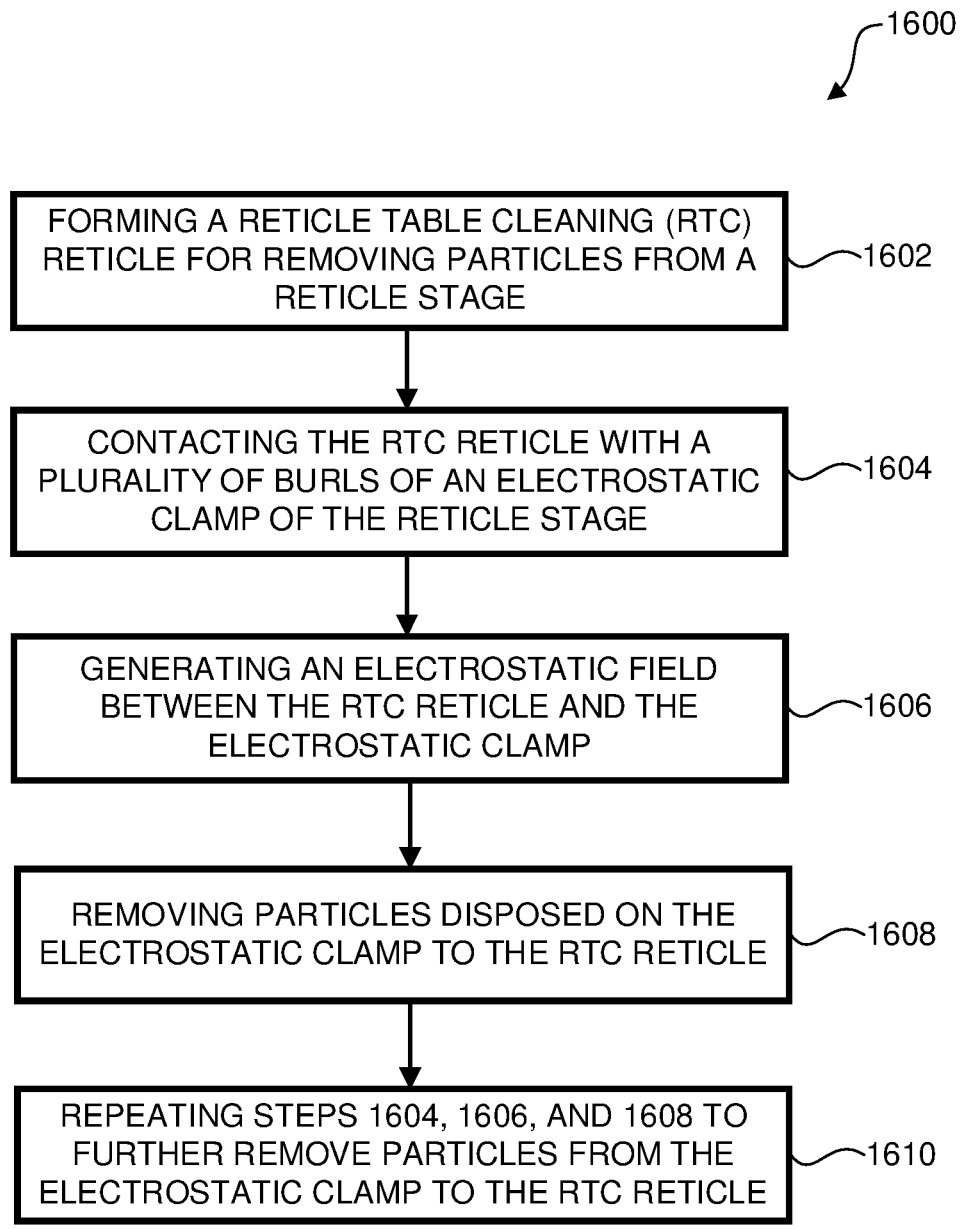
FIG. 16 illustrates a cleaning flow diagram for removing particles from a reticle stage to a RTC reticle, according to an exemplary embodiment.

FIG. 16 illustrates cleaning flow diagram 1600 for removing contaminants (e.g., first particle 210, second particle 212, etc.) from reticle stage 200 to RTC reticles 400, 400', 400", 400''', 400'''', 400''''', 400'''''', according to an exemplary embodiment. It is to be appreciated that not all steps in FIG. 16 are needed to perform the disclosure provided herein. Further, some of the steps may be performed simultaneously, sequentially, and/or in a different order than shown in FIG. 16. Cleaning flow diagram 1600 shall be described with reference to FIGS. 4-14. However, cleaning flow diagram 1600 is not limited to those example embodiments.

In step 1602, as shown in the example of FIGS. 4-14, RTC reticle 400, 400', 400", 400''', 400'''', 400''''', 400'''''' can be formed for removing contaminants (e.g., first particle 210, second particle 212, etc.) from reticle stage 200. In some embodiments, as shown in FIG. 15, RTC reticles 400, 400', 400", 400''', 400'''', 400''''', 400'''''' can be formed using manufacturing flow diagram 1500.

In step 1604, as shown in the example of FIG. 6B, RTC reticle 400, 400', 400", 400''', 400'''', 400''''', 400'''''' can contact burls 208 of electrostatic clamp 204 of reticle stage 200. In some embodiments, RTC reticles 400, 400', 400", 400''', 400'''', 400''''', 400'''''' can physically contact burls 208 of electrostatic clamp 204 of reticle stage 200 such that burls 208 oppose first frontside layer 410 (e.g., conductive) in a substantially perpendicular direction. For example, positioner 430 can align first frontside layer 410 with burls 208 of electrostatic clamp 204. In some embodiments, RTC reticles 400, 400', 400", 400''', 400'''', 400''''', 400'''''' can physically contact burls 208 of electrostatic clamp 204 of reticle stage 200 such that burls 208 oppose second frontside layer 412', 412" (e.g., conductive) in a substantially perpendicular direction. For example, positioner 430 can align second frontside layer 412', 412" with burls 208 of electrostatic clamp 204.

In step 1606, as shown in the example of FIG. 6B, one or more electrostatic fields can be generated between RTC reticle 400, 400', 400", 400''', 400'''', 400''''', 400'''''' and electrostatic clamp 204 of reticle stage 200. In some embodiments, a voltage difference ΔV can be applied between RTC reticle 400 and reticle stage 200 (e.g., by applying voltage to clamp electrodes 206 and/or first frontside layer 410) to generate an electrostatic field between RTC reticle 400 and reticle stage 200. In some embodiments, a first electrostatic field can be generated between first frontside layer 410 and electrostatic clamp 204 (e.g., between burls 208), and a second electrostatic field can be generated between second frontside layer 412', 412" and electrostatic clamp 204 (e.g., at burls 208).

In step 1608, as shown in the example of FIG. 6C, contaminants (e.g., first particle 210, second particle 212, etc.) disposed on electrostatic clamp 204 can be removed from reticle stage 200 to RTC reticle 400, 400', 400", 400''', 400'''', 400''''', 400''''''. In some embodiments, the one or more generated electrostatic fields create an electrostatic force(s) (e.g., Lorentz force) and/or a Van der Waals force(s) on contaminants (e.g., first particle 210, second particle 212, etc.) and causes the contaminants to move from reticle stage 200 to RTC reticle 400. Contaminants (e.g., first particle 210, second particle 212, etc.) contact first frontside layer 410 (e.g., conductive) and/or second frontside layer 412', 412" (e.g., conductive) and remain on frontside 402. Further, any charge accumulated on electrostatic clamp 204 can be dissipated when first frontside layer 410 (e.g., conductive) contacts electrostatic clamp 204.

In step 1610, as shown in the example of FIGS. 6A-6C, steps 1604, 1606, and 1608 can be repeated (e.g., multiple cycles) to further remove contaminants (e.g., first particle 210, second particle 212, etc.) from electrostatic clamp 204 to RTC reticle 400, 400', 400'', 400''', 400'''', 400''''', 400''''''.

In some embodiments, step 1604 can include contacting burls 208 with first frontside layer 410 in order to dissipate charge accumulated on electrostatic clamp 204. In some embodiments, step 1604 can include contacting burls 208 with second frontside layer 412', 412" in order to remove contaminants (e.g., first particle 210, second particle 212, etc.) on electrostatic clamp 204. In some embodiments, step 1604 can include contacting burls 208 with first frontside layer 410, 410' in order to remove contaminants (e.g., first particle 210, second particle 212, etc.) on electrostatic clamp 204. For example, as shown in FIGS. 13 and 14, burls 208 can be disposed in first frontside layer recesses 411 such that contaminants (e.g., first particle 210) between burls 208 can be removed.

In some embodiments, step 1606 can include generating an electrostatic field between second frontside layer 412', 412" and electrostatic clamp 204. For example, a voltage can be applied to first frontside layer 410 in a bottom surface of grooves 414, 414' that is electrically coupled to second frontside layer 412', 412" atop first frontside layer 410 within grooves 414, 414'.

The embodiments may further be described using the following clauses:

1. A reticle stage cleaning apparatus for a reticle stage in a lithographic apparatus, the apparatus comprising:
    a substrate having a frontside and a backside opposite the frontside; and
    a conductive layer disposed on the frontside of the substrate and configured to contact the reticle stage to dissipate charge on the reticle stage and to remove particles on the reticle stage via an electrostatic field generated between the conductive layer and the reticle stage.
2. The apparatus of clause 1, wherein a stiffness of the conductive layer is lower than a stiffness of the substrate.
3. The apparatus of clause 1, wherein the conductive layer comprises a conductive polymer.
4. The apparatus of clause 3, wherein the conductive polymer comprises a conductive polyimide.
5. The apparatus of clause 4, wherein the conductive polyimide comprises a doped polyimide comprising carbon, graphite, carbon black, carbon nanotubes, carbon fullerenes, metal particles, and/or some combination thereof.
6. The apparatus of clause 1, further comprising a second layer disposed between the conductive layer and the substrate.
7. The apparatus of clause 6, wherein the second layer comprises an insulating polymer.
8. The apparatus of clause 1, wherein the conductive layer is substantially planar.
9. The apparatus of clause 1, wherein the conductive layer has a thickness no greater than 8 microns in order to generate the electrostatic field between the conductive layer and the reticle stage.
10. The apparatus of clause 1, further comprising a voltage source electrically coupled to the conductive layer.
11. The apparatus of clause 10, wherein the voltage source is disposed within the substrate.
12. The apparatus of clause 1, further comprising a positioner coupled to the backside of the substrate and configured to translate the conductive layer relative to the reticle stage.
13. The apparatus of clause 1, further comprising a second conductive layer configured to remove particles on the reticle stage via a second electrostatic field generated between the second conductive layer and the reticle stage, wherein:
    the substrate comprises a plurality of grooves;
    the conductive layer is disposed on the frontside of the substrate and on a bottom surface of the plurality of grooves; and
    the second conductive layer is disposed atop the conductive layer in the bottom surface of the plurality of grooves.
14. The apparatus of clause 13, wherein a stiffness of the second conductive layer is lower than a stiffness of the conductive layer.
15. The apparatus of clause 13, wherein the second conductive layer comprises a conductive polymer.
16. The apparatus of clause 15, wherein the conductive polymer comprises a block or a sheet having a thickness greater than 8 microns.
17. The apparatus of clause 13, wherein the plurality of grooves comprise a tapered cross-section.
18. The apparatus of clause 13, wherein the plurality of grooves in a plan view are arranged in rectangular rows, rectangular columns, a concentric shape, a spiral shape, an elliptical shape, a square shape, and/or a polygon shape.
19. A lithographic apparatus comprising:
    an illumination system configured to illuminate a patterning device;
    a projection system configured to project an image of the patterning device onto a patterning substrate;
    a reticle stage configured to support the patterning device and comprising a chuck and an electrostatic clamp comprising a plurality of burls; and
    a reticle stage cleaning apparatus configured to dissipate charge on the electrostatic clamp and to remove particles on the electrostatic clamp, the reticle stage cleaning apparatus comprising:
        a substrate having a frontside and a backside opposite the frontside; and
        a conductive layer disposed on the frontside of the substrate and configured to contact the plurality of burls of the electrostatic clamp and to remove particles on the electrostatic clamp via an electrostatic field generated between the conductive layer and the electrostatic clamp.
20. The lithographic apparatus of clause 19, wherein the conductive layer comprises a conductive polymer having a stiffness lower than a stiffness of the substrate.
21. The lithographic apparatus of clause 19, further comprising a second conductive layer configured to remove particles on the electrostatic clamp via a second electrostatic field generated between the second conductive layer and the electrostatic clamp, wherein:
    the substrate comprises a plurality of grooves;
    the conductive layer is disposed on the frontside of the substrate and a bottom surface of the plurality of grooves; and
    the second conductive layer is disposed atop the conductive layer in the bottom surface of the plurality of grooves.
22. The lithographic apparatus of clause 19, further comprising a positioner coupled to the backside of the substrate and configured to translate the conductive layer relative to the plurality of burls of the electrostatic clamp.

23. A method of forming a reticle stage cleaning apparatus for removing particles on a reticle stage in a lithographic apparatus, the method comprising:
   forming a plurality of grooves in a substrate having a frontside and a backside opposite the frontside;
   disposing a conductive layer on the frontside of the substrate and on a bottom surface of the plurality of grooves; and
   disposing a second conductive layer atop the conductive layer in the bottom surface of the plurality of grooves, wherein the second conductive layer comprises a conductive polymer having a stiffness lower than a stiffness of the conductive layer.

24. The method of clause 23, wherein the disposing the second conductive layer comprises disposing a spin-on conductive polymer in the plurality of grooves.

25. The method of clause 23, wherein the disposing the second conductive layer comprises disposing a spin-on adhesive in the plurality of grooves and disposing the conductive polymer atop the spin-on adhesive in the plurality of grooves.

26. The method of clause 23, wherein the forming the plurality of grooves comprises etching the substrate such that the plurality of grooves comprise a tapered cross-section.

27. The method of clause 23, wherein the disposing the second conductive layer comprises disposing a block or a sheet of the conductive polymer within the plurality of tapered grooves.

28. A method of removing particles on a reticle stage in a lithographic apparatus, the method comprising:
   forming a reticle stage cleaning apparatus, the reticle stage cleaning apparatus comprising:
      a substrate having a frontside and a backside opposite the frontside, wherein the substrate comprises a plurality of grooves;
      a conductive layer disposed on the frontside of the substrate and on a bottom surface of the plurality of grooves; and
      a second conductive layer disposed atop the conductive layer in the bottom surface of the plurality of grooves,
      wherein the second conductive layer comprises a conductive polymer having a stiffness lower than a stiffness of the conductive layer;
   contacting the reticle stage cleaning apparatus with a plurality of burls of an electrostatic clamp of the reticle stage;
   generating an electrostatic field between the reticle stage cleaning apparatus and the electrostatic clamp; and
   removing particles disposed on the electrostatic clamp.

29. The method of clause 28, wherein the contacting comprises contacting the plurality of burls with the conductive layer in order to dissipate charge on the electrostatic clamp.

30. The method of clause 28, wherein the contacting comprises contacting the plurality of burls with the second conductive layer in order to remove particles and parasitic charge on the electrostatic clamp.

31. The method of clause 30, wherein the generating comprises generating an electrostatic field between the second conductive layer and the electrostatic clamp.

32. The method of clause 28, further comprising repeating the contacting, the generating, and the removing steps to further remove particles from the electrostatic clamp to the reticle stage cleaning apparatus.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments have been described above, it will be appreciated that the embodiments may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the embodiments and the appended claims in any way.

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the embodiments. Therefore, such adaptations and modifications are intended to be within the meaning and range of equivalents of the disclosed embodiments, based on the teaching and guidance presented herein.

The breadth and scope of the embodiments should not be limited by any of the above-described exemplary embodiments, but should be defined only in accordance with the following claims and their equivalents.

The invention claimed is:

1. A reticle stage cleaning apparatus for a reticle stage in a lithographic apparatus, the apparatus comprising:
   a substrate having a frontside and a backside opposite the frontside; and
   a conductive layer comprising a conductive polymer having a stiffness lower than a stiffness of the substrate, the conductive layer disposed on the frontside of the substrate and configured to contact the reticle stage to dissipate charge on the reticle stage and to remove particles on the reticle stage via an electrostatic field generated between the conductive layer and the reticle stage.

2. The apparatus of claim 1, wherein:
   the conductive polymer comprises a conductive polyimide, and wherein the conductive polyimide comprises a doped polyimide comprising carbon, graphite, carbon black, carbon nanotubes, carbon fullerenes, metal particles, and/or some combination thereof.

3. The apparatus of claim 1, further comprising:
   a second layer disposed between the conductive layer and the substrate, wherein the second layer comprises an insulating polymer and wherein the conductive layer is substantially planar; and
   a positioner coupled to the backside of the substrate and configured to translate the conductive layer relative to the reticle stage.

4. The apparatus of claim 1, further comprising a voltage source electrically coupled to the conductive layer, wherein the voltage source is disposed within the substrate, and wherein the conductive layer has a thickness no greater than 8 microns in order to generate the electrostatic field between the conductive layer and the reticle stage.

5. The apparatus of claim 1, further comprising a second conductive layer configured to remove particles on the reticle stage via a second electrostatic field generated between the second conductive layer and the reticle stage, wherein:
   the substrate comprises a plurality of grooves;
   the conductive layer is disposed on the frontside of the substrate and on a bottom surface of the plurality of grooves; and
   the second conductive layer is disposed atop the conductive layer on the bottom surface of the plurality of grooves.

6. The apparatus of claim 5, wherein:
   a stiffness of the second conductive layer is lower than a stiffness of the conductive layer;
   the second conductive layer comprises a conductive polymer;
   the conductive polymer comprises a block or a sheet having a thickness greater than 8 microns; and
   the plurality of grooves comprise a tapered cross-section, and wherein the plurality of grooves in a plan view are arranged in rectangular rows, rectangular columns, a concentric shape, a spiral shape, an elliptical shape, a square shape, and/or a polygon shape.

7. A lithographic apparatus comprising:
   an illumination system configured to illuminate a patterning device;
   a projection system configured to project an image of the patterning device onto a patterning substrate;
   a reticle stage configured to support the patterning device and comprising a chuck and an electrostatic clamp comprising a plurality of burls; and
   a reticle stage cleaning apparatus configured to dissipate charge on the electrostatic clamp and to remove particles on the electrostatic clamp, the reticle stage cleaning apparatus comprising:
      a substrate having a frontside and a backside opposite the frontside; and
      a conductive layer comprising a conductive polymer having a stiffness lower than a stiffness of the substrate, the conductive layer disposed on the frontside of the substrate and configured to contact the plurality of burls of the electrostatic clamp and to remove particles on the electrostatic clamp via an electrostatic field generated between the conductive layer and the electrostatic clamp.

8. The lithographic apparatus of claim 7, further comprising a second conductive layer configured to remove particles on the electrostatic clamp via a second electrostatic field generated between the second conductive layer and the electrostatic clamp, wherein:
   the substrate comprises a plurality of grooves;
   the conductive layer is disposed on the frontside of the substrate and a bottom surface of the plurality of grooves; and
   the second conductive layer is disposed atop the conductive layer on the bottom surface of the plurality of grooves.

9. The lithographic apparatus of claim 7, further comprising a positioner coupled to the backside of the substrate and configured to translate the conductive layer relative to the plurality of burls of the electrostatic clamp.

10. A method of forming a reticle stage cleaning apparatus for removing particles on a reticle stage in a lithographic apparatus, the method comprising:
   forming a plurality of grooves in a substrate having a frontside and a backside opposite the frontside;
   disposing a conductive layer, comprising a conductive polymer having a stiffness lower than a stiffness of the substrate, on the frontside of the substrate and on a bottom surface of the plurality of grooves; and
   disposing a second conductive layer atop the conductive layer on the bottom surface of the plurality of grooves, wherein the second conductive layer comprises a conductive polymer having a stiffness lower than a stiffness of the conductive layer.

11. The method of claim 10, wherein the disposing the conductive polymer comprises disposing a spin-on conductive polymer.

12. The method of claim 10, wherein the disposing the second conductive layer comprises disposing a spin-on adhesive in the plurality of grooves and disposing the conductive polymer atop the spin-on adhesive in the plurality of grooves.

13. The method of claim 10, wherein the forming the plurality of grooves comprises etching the substrate such that the plurality of grooves comprise a tapered cross-section.

14. The method of claim 10, wherein the disposing the second conductive layer comprises disposing a block or a sheet of the conductive polymer within the plurality of tapered grooves.

\* \* \* \* \*